United States Patent
Tsunemine et al.

(10) Patent No.: US 9,929,042 B2
(45) Date of Patent: Mar. 27, 2018

(54) SEMICONDUCTOR DEVICE HAVING A DISCONTINUED PART BETWEEN A FIRST INSULATING FILM AND A SECOND INSULATING FILM

(71) Applicant: Renesas Electronics Corporation, Tokyo (JP)

(72) Inventors: Yoshikazu Tsunemine, Ibaraki (JP); Takayuki Igarashi, Ibaraki (JP)

(73) Assignee: Renesas Electronics Corporation, Koutou-ku, Tokyo (JP)

(*) Notice: Subject to any disclaimer, the term of this patent is extended or adjusted under 35 U.S.C. 154(b) by 21 days.

(21) Appl. No.: 15/150,597

(22) Filed: May 10, 2016

(65) Prior Publication Data

US 2016/0372419 A1 Dec. 22, 2016

(30) Foreign Application Priority Data

Jun. 16, 2015 (JP) .................................. 2015-121024

(51) Int. Cl.
| | | |
|---|---|---|
| H01L 27/32 | (2006.01) | |
| H01L 21/768 | (2006.01) | |
| H01L 23/532 | (2006.01) | |
| H01L 23/522 | (2006.01) | |

(52) U.S. Cl.
CPC .... *H01L 21/76877* (2013.01); *H01L 21/7682* (2013.01); *H01L 21/76816* (2013.01); *H01L 21/76847* (2013.01); *H01L 23/522* (2013.01); *H01L 23/53295* (2013.01); *H01L 23/53238* (2013.01)

(58) Field of Classification Search
CPC ............ H01L 23/3276; H01L 23/3288; H01L 23/3677; H01L 23/522; H01L 23/53238; H01L 27/124

See application file for complete search history.

(56) References Cited

U.S. PATENT DOCUMENTS

2013/0249102 A1   9/2013 Nakao et al.
2016/0133577 A1*  5/2016 Baek ................. H01L 23/53238
                                                    257/751

FOREIGN PATENT DOCUMENTS

JP        3-83340 A      4/1991
JP        2013-197407 A  9/2013

* cited by examiner

*Primary Examiner* — Hoai V Pham
(74) *Attorney, Agent, or Firm* — Sughrue Mion, PLLC

(57) ABSTRACT

A semiconductor device, in which an increase in the size of a product can be suppressed and a withstand voltage between wiring layers can be improved, and a manufacturing method thereof are provided. A discontinued part, in which the interface between an interlayer insulating film and a passivation film is discontinued, is formed between a first wiring layer and a second wiring layer that are adjacent to each other with a space therebetween. Both the interlayer insulating film and the passivation film face an air gap in the discontinued part.

15 Claims, 23 Drawing Sheets

SEMICONDUCTOR DEVICE HAVING A DISCONTINUED PART BETWEEN A FIRST INSULATING FILM AND A SECOND INSULATING FILM

CROSS-REFERENCE TO RELATED APPLICATIONS

The disclosure of Japanese Patent Application No. 2015-121024 filed on Jun. 16, 2015 including the specification, drawings and abstract is incorporated herein by reference in its entirety.

BACKGROUND

The present invention relates to a semiconductor device and a manufacturing method thereof.

The configuration of a wiring layer of the uppermost layer and a passivation film covering the wiring layer in a semiconductor device is disclosed, for example, in the following Japanese Unexamined Patent Application Publication No. Hei 3(1991)-83340 (see Patent Document 1) and Japanese Unexamined Patent Application Publication No. 2013-197407 (see Patent Document 2).

In Japanese Unexamined Patent Application Publication No. Hei 3(1991)-83340, Al (aluminum) wiring is formed over the upper surface of an atmospheric pressure-CVD (Chemical Vapor Deposition) insulating film. An SiN film (silicon nitride film) is formed, as a passivation film, so as to cover the atmospheric pressure-CVD insulating film and the Al wiring.

In FIG. 2 of Japanese Unexamined Patent Application Publication No. 2013-197407, an etching stopper film and a plurality of wiring are formed over an interlayer insulating film including a silicon oxide film. The wiring has a barrier metal film, a wiring film, and a passivation film. A cap insulating film is formed over the wiring such that an air gap is provided between the cap insulating film and the etching stopper film.

RELATED ART DOCUMENT

Patent Document

[Patent Document 1] Japanese Unexamined Patent Application Publication No. Hei 3(1991)-83340

[Patent Document 2] Japanese Unexamined Patent Application Publication No. 2013-197407

SUMMARY

In the aforementioned two publications, a continuous interface between two insulating films is present between wiring. An imperfect bond between atoms, such as a dangling bond, is present in the interface between the two insulating films. Such an imperfect bond between atoms serves as a current pathway when a voltage is applied between the wiring. As a result, breakdown may be caused in the interface between the wiring when a low voltage is applied between the wiring.

In order to increase a withstand voltage, a method can be employed in which the space between wiring is expanded. In this method, however, the size of a product becomes large.

Other problems and new characteristics will become clear from the description and accompanying drawings of the present specification.

According to one embodiment, a discontinued part, in which the interface between a first insulating film and a second insulating film is discontinued, is formed between a first wiring layer and a second wiring layer that are adjacent to each other with a space therebetween. In the discontinued part, at least one of the first insulating film and the second insulating film faces an air gap.

According to the one embodiment, an increase in the size of a product can be suppressed, and the withstand voltage between the first and second wiring layers can be improved.

DETAILED DESCRIPTION

Hereinafter, embodiments will be described based on the accompanying drawings.

First Embodiment

A configuration of a semiconductor device according to the present embodiment will first be described with reference to FIGS. 1 and 2.

Figure 2:
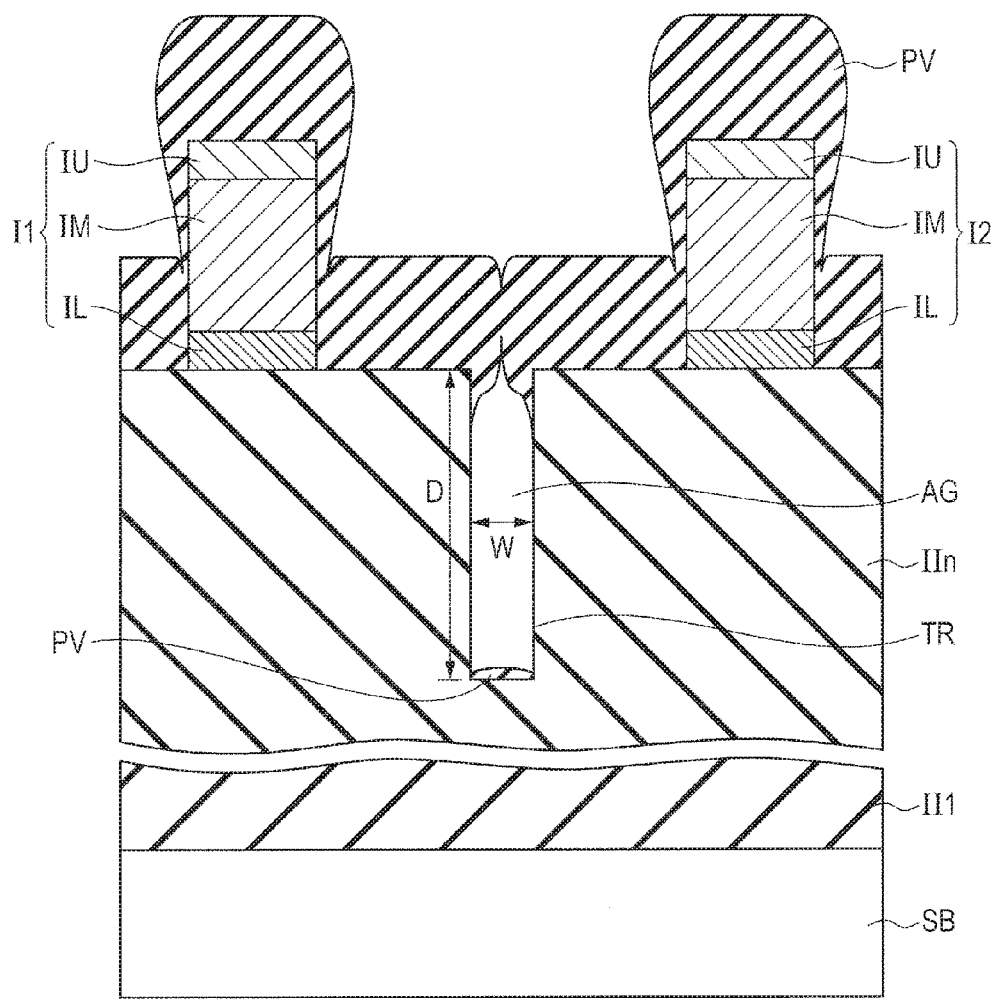
FIG. 2 is a schematic sectional view, taken along II-II Line in FIG. 1.

As illustrated in FIG. 2, a semiconductor substrate SB includes, for example, silicon. For example, a MOS (Metal Oxide Semiconductor) transistor (not illustrated) and the like are formed over the surface of the semiconductor substrate SB.

An interlayer insulating film II1 is formed over the surface of the semiconductor substrate SB so as to cover the MOS transistor and the like. A conductive layer (not illustrated), such as a wiring layer, is formed over the interlayer insulating film II1.

Such interlayer insulating films and conductive layers are laminated repeatedly. Of a plurality of interlayer insulating films, an interlayer insulating film (first insulating film) IIn is an interlayer insulating film in the uppermost layer. The interlayer insulating film IIn is an insulating film containing silicon oxide, and is comprised of, for example, a silicon oxide film.

A plurality of wiring layers I1 and I2 are arranged over the interlayer insulating film IIn. The wiring layers I1 and I2 include a first wiring layer I1 and a second wiring layer I2. Each of the first wiring layer I1 and the second wiring layer I2 is a wiring layer of the uppermost layer.

The lower surfaces of both the first wiring layer I1 and the second wiring layer I2 come in contact with the upper surface of the interlayer insulating film IIn. The first wiring layer I1 and the second wiring layer I2 are adjacent to each other with a space therebetween.

Each of the first wiring layer I1 and the second wiring layer I2 has a wiring lower layer IL, a wiring body layer IM, and a wiring upper layer IU. Each of the first wiring layer I1 and the second wiring layer I2 is formed by laminating the wiring lower layer IL, the wiring body layer IM, and the wiring upper layer IU in this order from below.

The wiring lower layer IL includes, for example, titanium nitride (TiN). The wiring body layer IM includes, for example, aluminum. The wiring upper layer IU includes, for example, titanium nitride.

A passivation film (second insulating film) PV is formed to cover the first wiring layer I1 and the second wiring layer I2. The passivation film PV includes a material different from that of the interlayer insulating film IIn. The passivation film PV is an insulating film containing silicon nitride, and is, for example, a silicon nitride film.

Specifically, the passivation film PV includes p-SiN (plasma silicon nitride film), p-SiON (plasma silicon oxynitride film), p-SiN/p-SiO$_2$ (plasma silicon nitride film/plasma silicon oxide film), p-SiON/p-SiO$_2$ (plasma silicon oxynitride film/plasma silicon oxide film), or the like.

The passivation film PV comes in contact with the interlayer insulating film IIn as well as the upper surfaces and the side surfaces of both the first wiring layer I1 and the second wiring layer I2.

A discontinued part, in which the interface between the interlayer insulating film IIn and the passivation film PV is discontinued, is formed between the first wiring layer I1 and the second wiring layer I2. In the discontinued part, at least one of the interlayer insulating film IIn and the passivation film CV faces an air gap AG.

Specifically, a trench TR is formed in the upper surface of the interlayer insulating film IIn in an area between the first wiring layer I1 and the second wiring layer I2. The air gap AG is formed in the trench TR with the passivation film CV blocking the trench TR.

The passivation film PV is deposited to some extent over the bottom surface of the trench TB, but not deposited over part of the side surface of the trench TR. Accordingly, the interface between the interlayer insulating film IIn and the passivation film PV is discontinued inside the trench TR. Both the interlayer insulating film IIn and the passivation film PV face the air gap AG.

It is preferable that a depth D with respect to a width W (aspect ratio (depth D/width W)) of the trench TR is large. The width W of the trench TR is, for example, 100 nm, while the depth D is, for example, 1000 nm.

Figure 1:
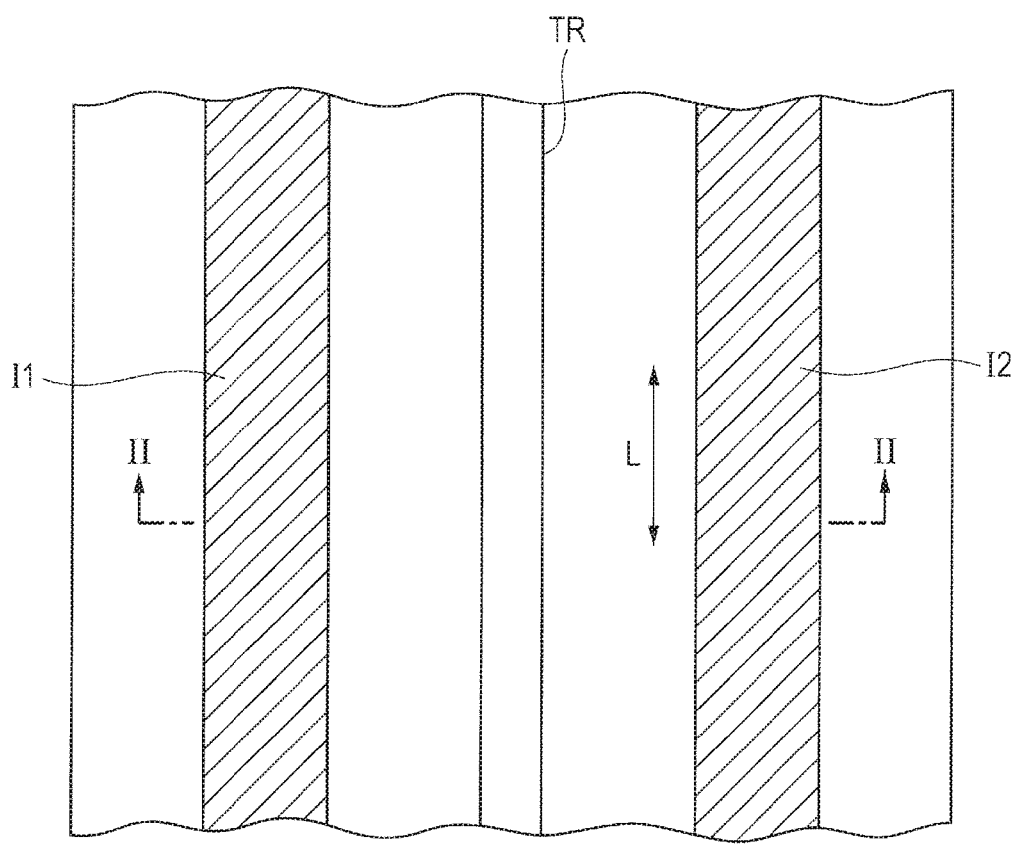
FIG. 1 is a plan view schematically illustrating a configuration of a semiconductor device in First Embodiment.

As illustrated in FIG. 1, the trench TR is located between the first wiring layer I1 and the second wiring layer I2 in plan view. The trench TR is not required to be located, in plan view, across the whole size in the longitudinal direction (direction of Arrow L) of the interface between the first wiring layer I1 and the second wiring layer I2. The trench TR is only required to be arranged, in plan view, in at least a partial region of the size in the longitudinal direction (direction of Arrow L) of the interface between the first wiring layer I1 and the second wiring layer I2.

The plan view in the present specification means a state obtained when viewed from the direction perpendicular to the surface of the semiconductor substrate SB, as illustrated in the plan view of FIG. 1.

Figure 3:
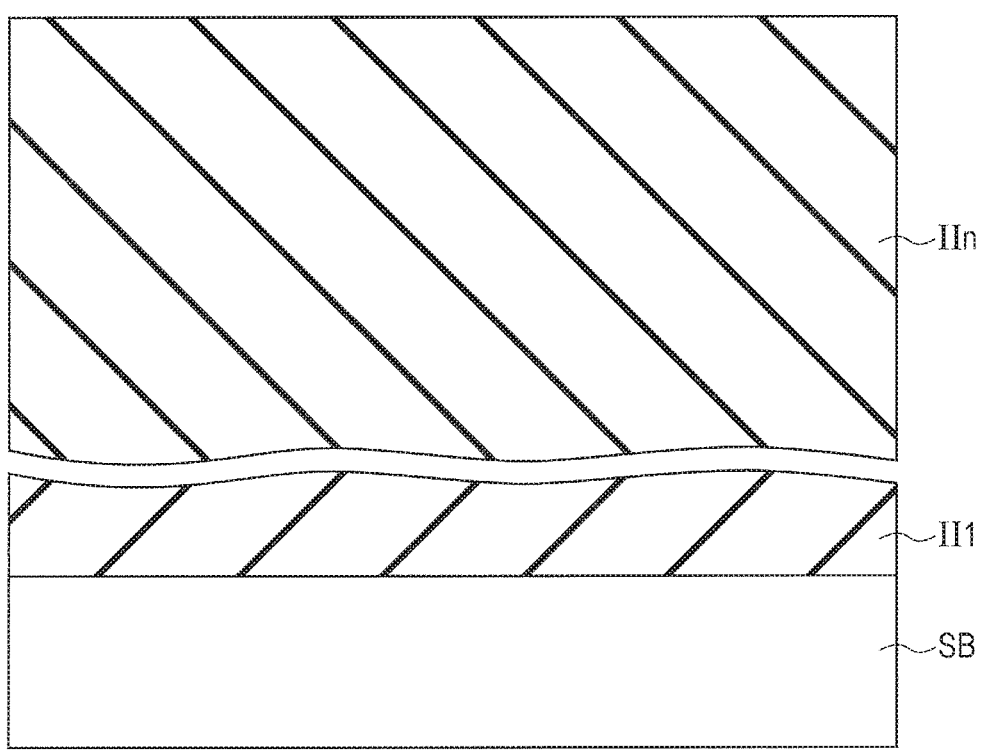
FIG. 3 is a sectional view schematically illustrating a first step of a manufacturing method of a semiconductor device in First Embodiment.

Subsequently, a manufacturing method of a semiconductor device according to the present embodiment will be described with reference to FIGS. 3 to 11. For example, an MOS transistor (not illustrated) and the like are formed over the surface of the semiconductor substrate SB, as illustrated in FIG. 3. The interlayer insulating film II1 is formed over the surface of the semiconductor substrate SB so as to cover the MOS transistor and the like. A conductive layer (not illustrated), such as a wiring layer, is formed over the interlayer insulating film II1.

Such interlayer insulating films and conductive layers are repeatedly laminated to the interlayer insulating film IIn in the uppermost layer. A conductive plug (not illustrated), which is used for electrically coupling a lower wiring layer with an upper wiring layer of an interlayer insulating film, is usually formed in the interlayer insulating film.

Figure 4:
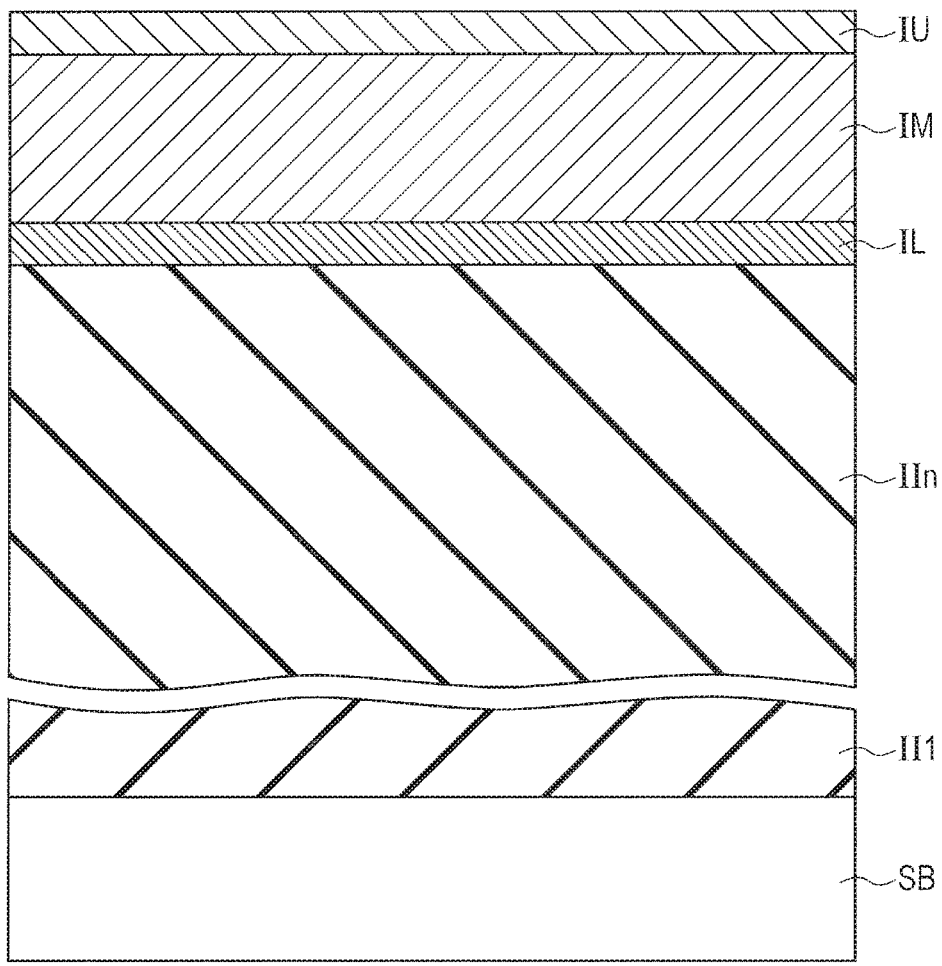
FIG. 4 is a sectional view schematically illustrating a second step of the manufacturing method of a semiconductor device in First Embodiment.

As illustrated in FIG. 4, the wiring lower layer IL, the wiring body layer IM, and the wiring upper layer IU are sequentially formed over the interlayer insulating film IIn in the uppermost layer. The wiring lower layer IL is formed, for example, by titanium nitride, the wiring body layer IM, for example, by aluminum, and the wiring upper layer IU, for example, by titanium nitride.

The wiring lower layer IL, the wiring body layer IM, and the wiring upper layer IU are formed by a normal sputtering process. The thickness of each of the wiring lower layer IL, the wiring body layer IM, and the wiring upper layer IU is not limited. The thickness of each of the wiring lower layer IL and the wiring upper layer IU is, for example, 100 nm. The thickness of the wiring body layer IM is, for example, 1000 nm.

Further, than titanium layers, although not illustrated, may be formed over and below the wiring upper layer 10 and the wiring lower layer IL including titanium nitride, respectively, in order to improve the adhesiveness with an upper layer and a lower layer or to reduce contact resistance.

Figure 5:
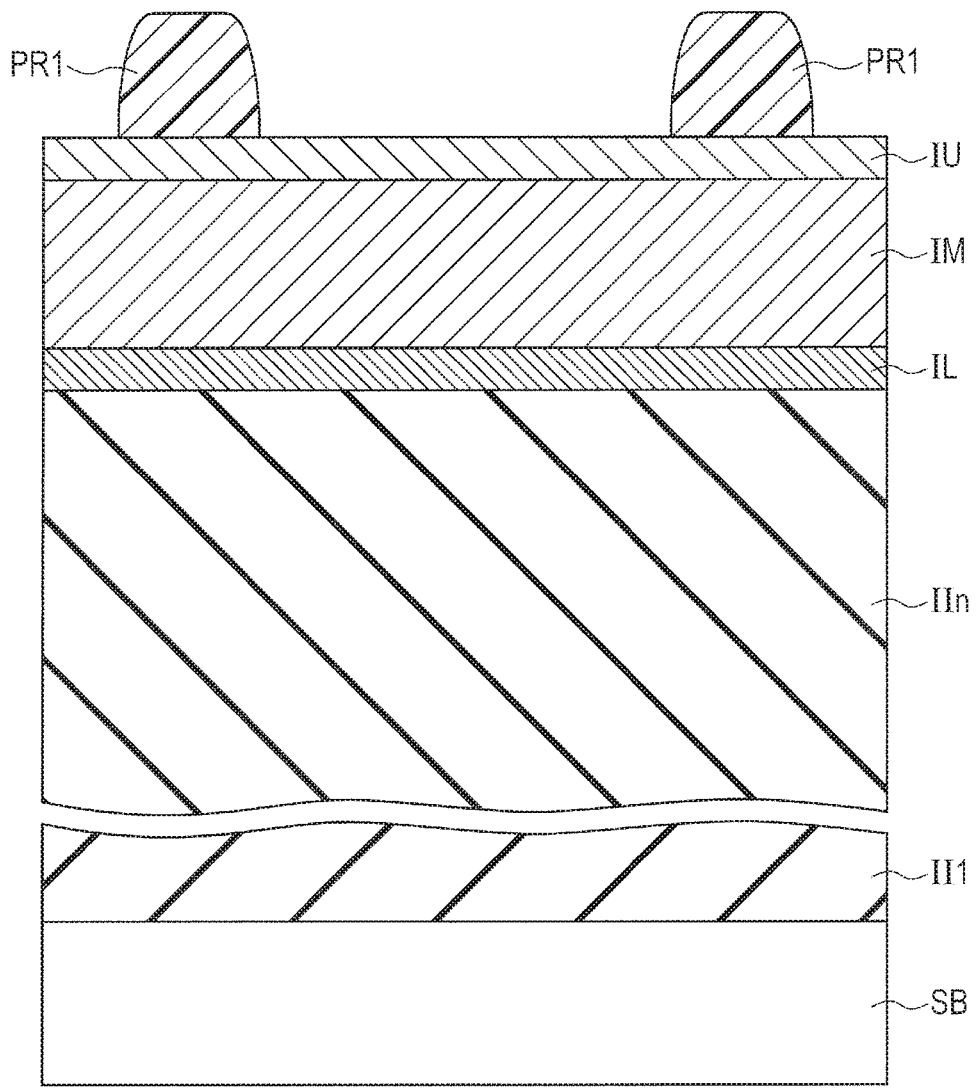
FIG. 5 is a sectional view schematically illustrating a third step of the manufacturing method of a semiconductor device in First Embodiment.

As illustrated in FIG. 5, a photoresist pattern PR1 is formed over the wiring upper layer IU by a normal photolithography technique. The wiring upper layer IU, the wiring body layer IM, and the wiring lower layer IL are etched in this order by using the pattern PR1 as a mask. For example, normal plasma etching is used as the etching.

Figure 6:
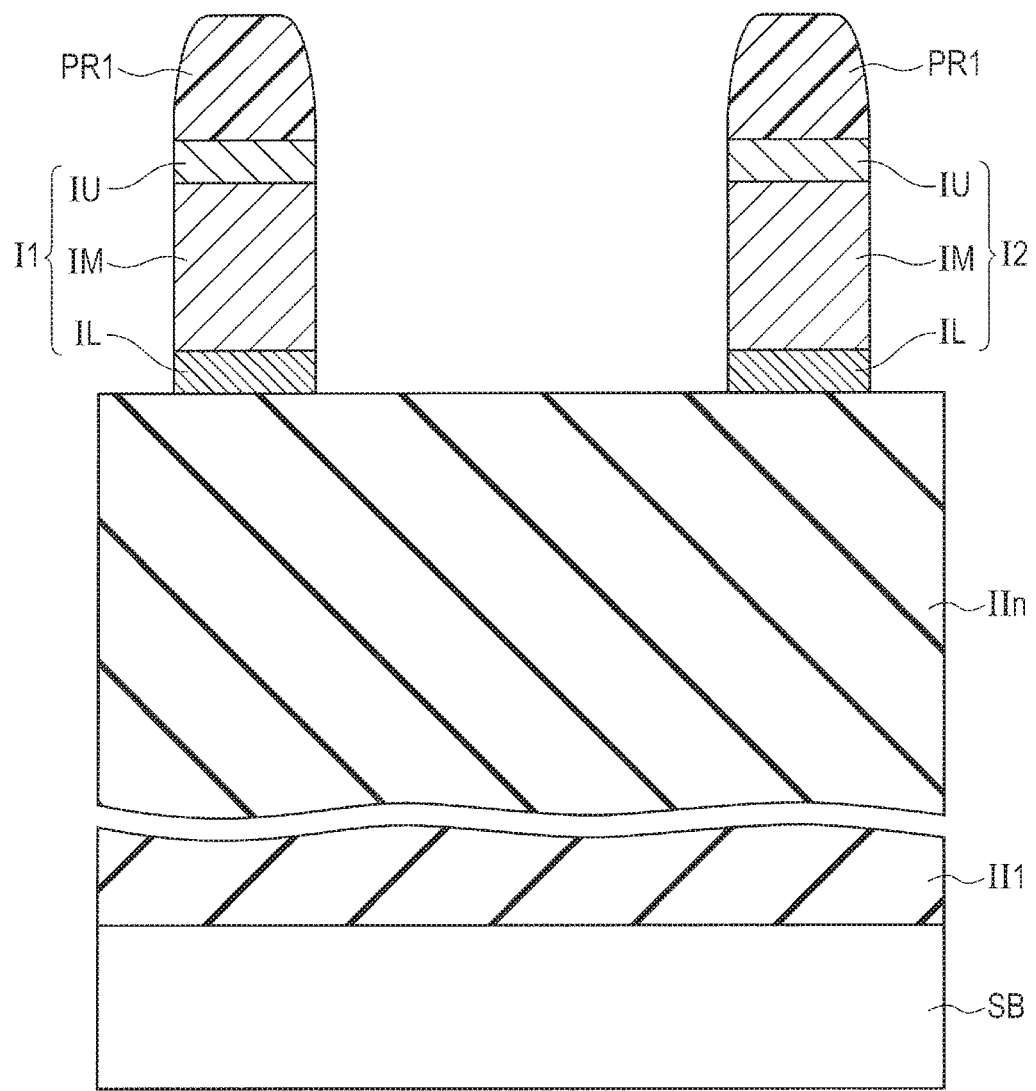
FIG. 6 is a sectional view schematically illustrating a fourth step of the manufacturing method of a semiconductor device in First Embodiment.

As illustrated in FIG. 6, the wiring upper layer IU, the wiring body layer IM, and the wiring lower layer IL are patterned by the aforementioned etching technique. Thereby, the first wiring layer I1 and the second wiring layer I2, each of which includes a laminated structure formed by the wiring lower layer IL, the wiring body layer IM, and the wiring upper layer IU, are formed.

Thereafter, the pattern PR1 is removed by a resist removing process using normal oxygen ashing. A wet process may be used in combination, if necessary.

Figure 7:
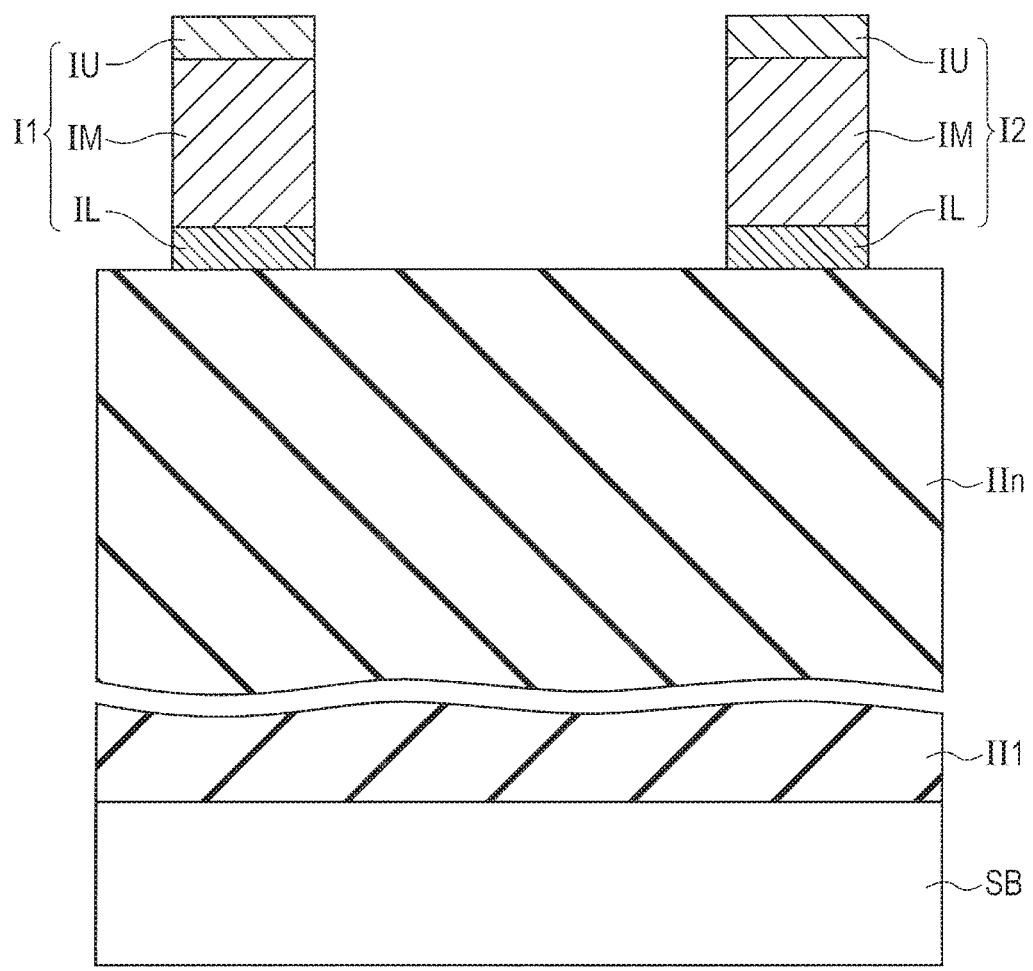
FIG. 7 is a sectional view schematically illustrating a fifth step of the manufacturing method of a semiconductor device in First Embodiment.

As illustrated in FIG. 7, the upper surface of each of the first wiring layer I1 and the second wiring layer I2 (upper surface of the wiring upper layer IU) is exposed by the aforementioned resist removing process.

Figure 8:
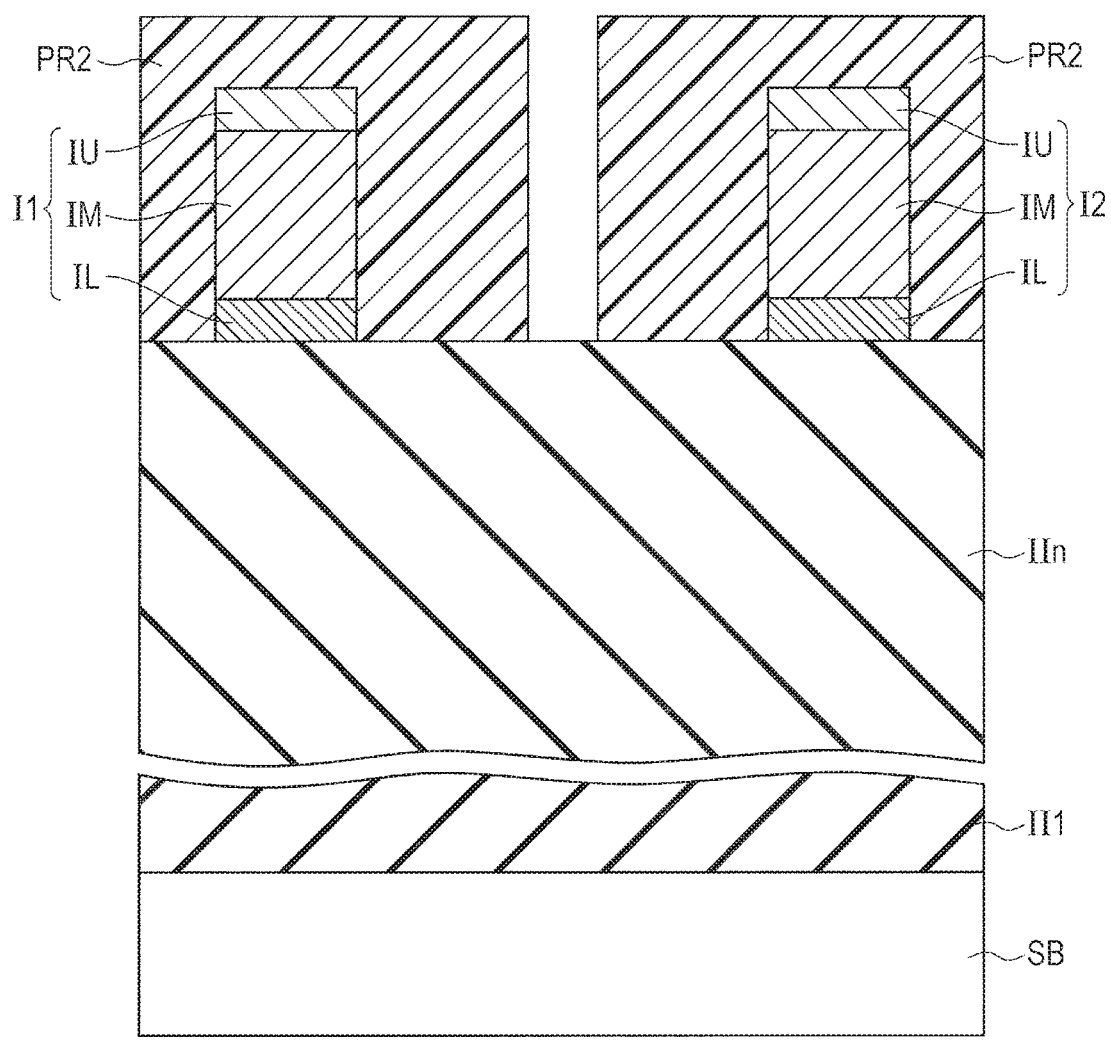
FIG. 8 is a sectional view schematically illustrating a sixth step of the manufacturing method of a semiconductor device in First Embodiment.

As illustrated in FIG. 8, a photoresist pattern PR2 is formed by a normal photolithography technique. The pattern PR2 is formed to cover each of the first wiring layer I1 and the second wiring layer I2 and to expose the upper surface of the interlayer insulating film IIn between the first wiring layer I1 and the second wiring layer I2.

The interlayer insulating film IIn is etched by using the pattern PR2 as a mask. For example, normal plasma etching is used as the etching.

Figure 9:
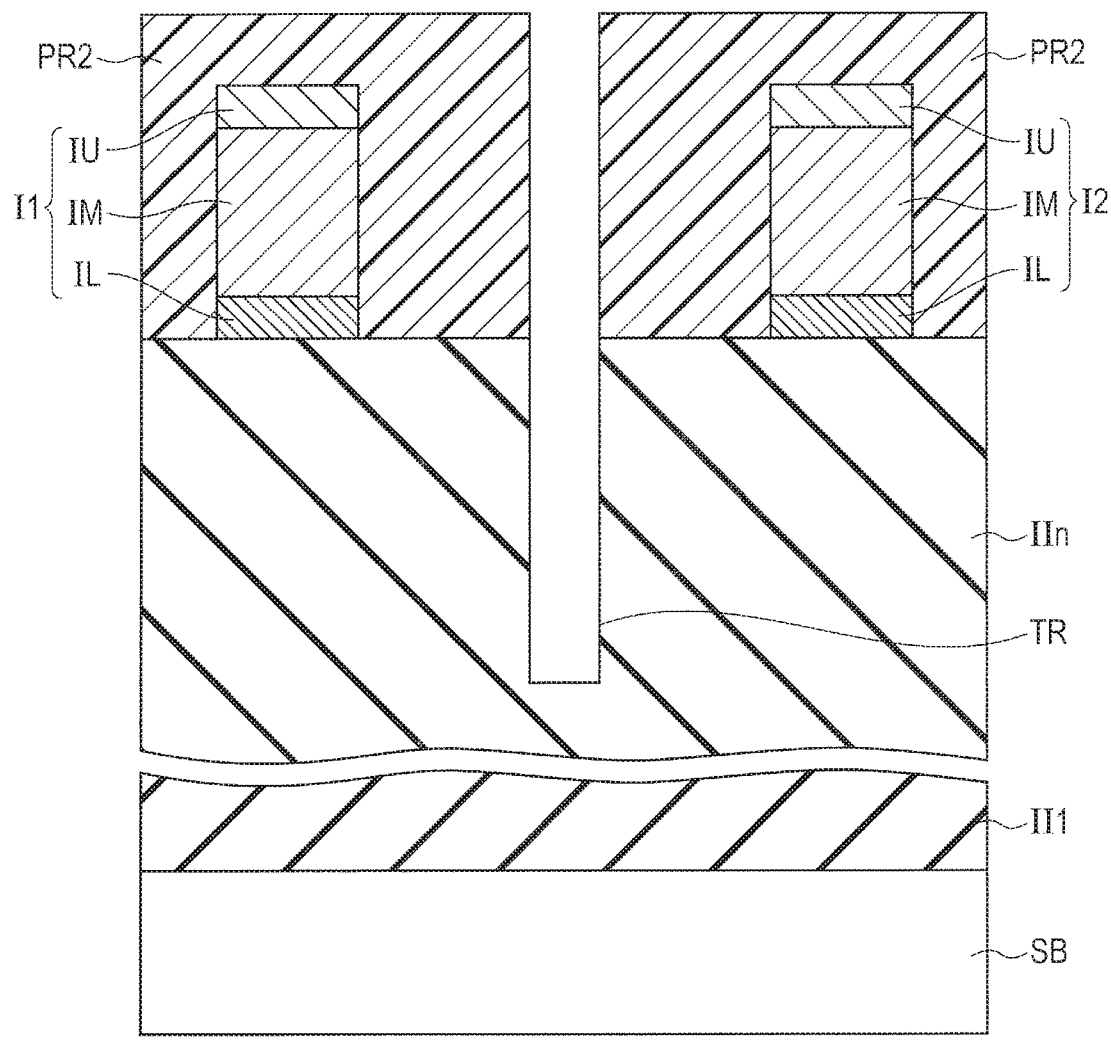
FIG. 9 is a sectional view schematically illustrating a seventh step of the manufacturing method of a semiconductor device in First Embodiment.

As illustrated in FIG. 9, the trench TR is formed in the interlayer insulating film IIn by the aforementioned etching technique. If the following air gap can be formed, the width and depth of the trench TR are not limited. Herein, the width of the trench TR is, for example, 100 nm, and the depth is, for example, 1000 nm.

Alternatively, a silicon oxide film inside the trench TB may be slightly etched in this state by using a chemical that dissolves a silicon oxide film, such as dilute hydrofluoric acid. Thereby, a damaged layer, which may be caused during the dry etching, can be removed.

Thereafter, the pattern PR2 is removed by a resist removing process using normal oxygen ashing. A wet process may be used in combination, if necessary. Also herein, the upper surface of the interlayer insulating film IIn may be intentionally and slightly dissolved by using a chemical.

Figure 10:
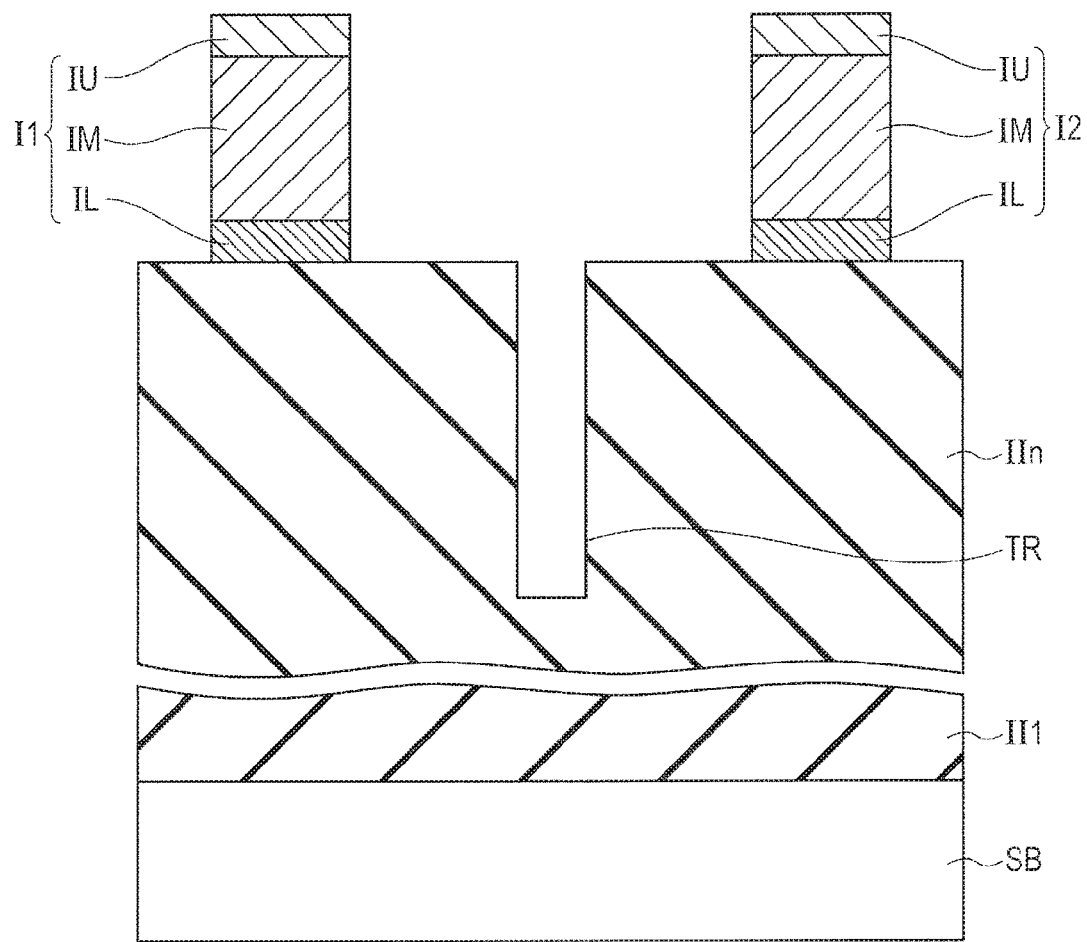
FIG. 10 is a sectional view schematically illustrating an eighth step of the manufacturing method of a semiconductor device in First Embodiment.

As illustrated in FIG. 10, the upper surface of the interlayer insulating film IIn is exposed by the aforementioned resist removing process.

Figure 11:
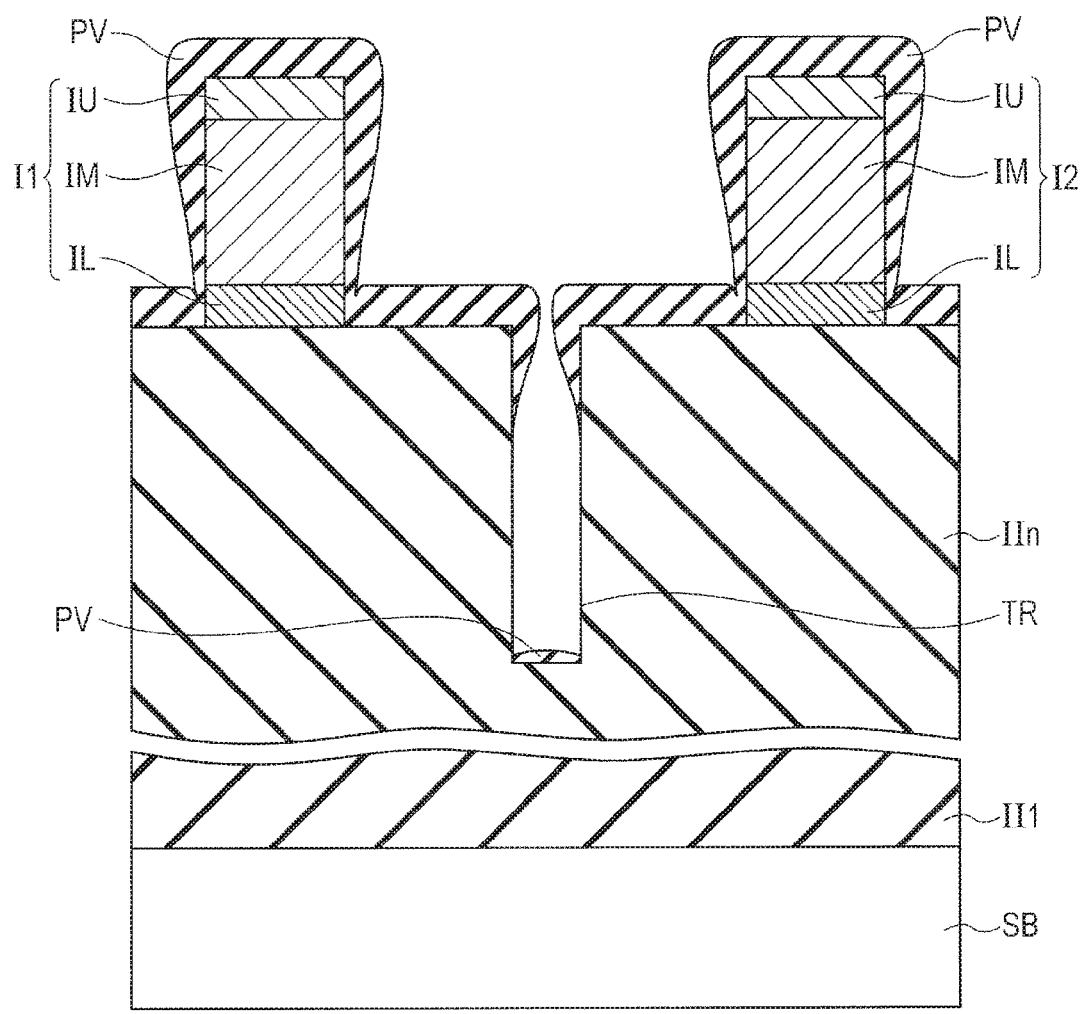
FIG. 11 is a sectional view schematically illustrating ninth step of the manufacturing method of a semiconductor device in First Embodiment.

As illustrated in FIG. 11, the passivation film PV including a silicon nitride film is formed by a normal plasma CVD method. In this film formation, the passivation film PV is thickly deposited in the upper end part of the trench TR, and is not deposited in a lower part thereof.

By further thickly forming the passivation film, the upper end of the trench TR is blocked by the passivation film PV, as illustrated in FIG. 2. Thereby, the blocked air gap AG is formed in the trench TR.

The semiconductor device according to the present embodiment illustrated in FIGS. 1 and 2 is manufactured by the aforementioned steps.

Although not depicted in FIG. 1, a margin to the block of the terminal end part of the air gap AG can be increased by causing the planar shape of the terminal end part of the trench TR to be a tapered shape like a wedge shape.

Herein, the wiring upper layer IU may be omitted if unnecessary. Further, a silicon nitride film is most commonly used as a material of the passivation film PV, but a laminated film of a silicon oxide film and a silicon nitride film may be used.

In the aforementioned manufacturing method, the trench TR having, for example, a width of 100 nm and a depth of 1000 nm is formed, but a depth of 1000 nm may not be secured depending on the thickness of the interlayer insulating film IIn, the height of the wiring structure in the lower layer of the interlayer insulating film IIn, or the like. In that case, the depth of the trench TR may be reduced.

When the depth of the trench TR is reduced, it can be considered that the whole passivation film PV is etched once by wet etching or isotropic dry etching before the trench TR is blocked, as illustrated in FIG. 11. There is the possibility that the passivation film PV formed over the sidewall of the trench TR can be removed by the whole etching. Because the passivation film PV over the sidewall of the trench TR can be removed by the whole etching, the interface between the interlayer insulating film IIn and the passivation film PV can be securely discontinued in the trench TR, even when the depth of the trench TR is reduced.

This technique can also be applied to manufacturing methods of other embodiments. Further, it is also effective improvement measures to reduce a period of time until the passivation film PV blocks the trench TR by making the width of the trench TR small, or to simply provide a plurality of rows of the trenches TR.

Subsequently, a configuration, obtained when the configuration of the present embodiment is applied to a microisolator, will be described with reference to FIGS. 12 and 13.

Figure 12:
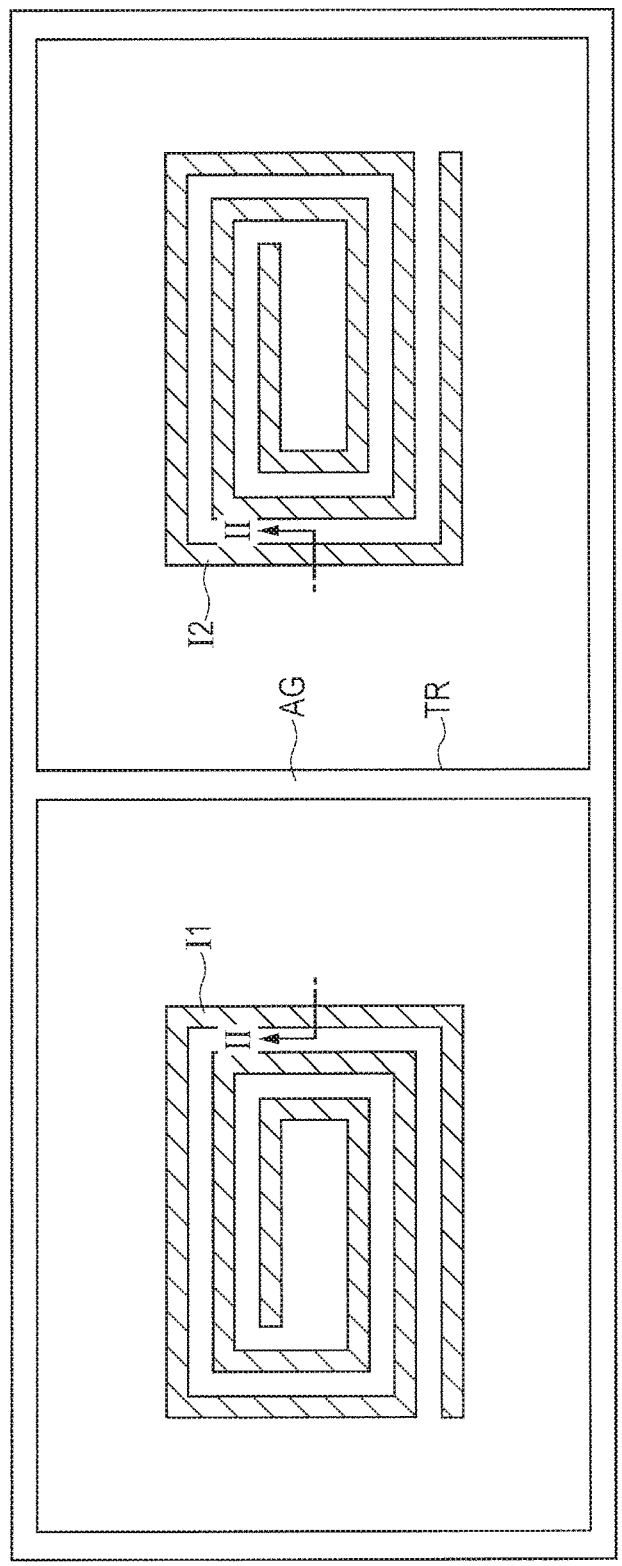
FIG. 12 is a plan view schematically illustrating a first example in which the configuration of FIG. 1 is applied to a microisolator.

A microisolator means a circuit provided with a function of transmitting a signal by using a pair of transformers formed over a semiconductor chip by using the wiring layers I1 and I2, as illustrated in FIG. 12.

The first wiring layer I1 is one transformer that forms the microisolator, while the second wiring layer I2 is the other transformer that forms it.

The trench TR and the air gap AG are continuously extended to surround the whole circumference of each of the first wiring layer I1 and the second wiring layer I2.

Figure 13:
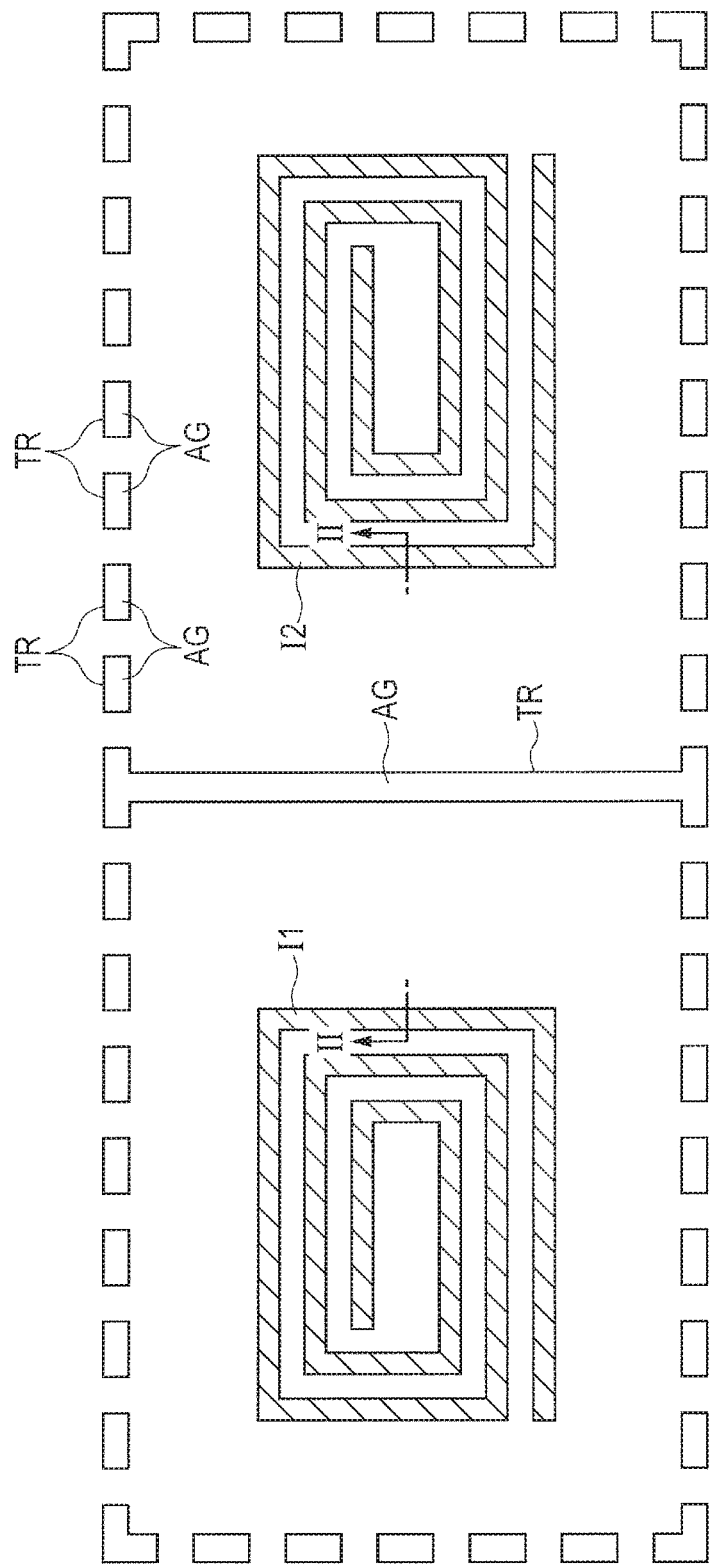
FIG. 13 is a plan view schematically illustrating a second example in which the configuration of FIG. 1 is applied to a microisolator.

Alternatively, the trench TR and the air gap AG may be intermittently extended to surround the whole circumference of each of the first wiring layer I1 and the second wiring layer I2, as illustrated in FIG. 13.

The schematic section taken along II-II Line in each of FIGS. 12 and 13 has a configuration corresponding to that illustrated in FIG. 2.

Of the configurations in FIGS. 12 and 13, the configurations other than those described above are almost the same as those of the present embodiment illustrated in FIGS. 1 and 2, and hence like elements are denoted with like reference numerals and description thereof is not repeated.

Subsequently, operations and effects of the present embodiment will be described. According to the present embodiment, a discontinued part, in which the interface between the interlayer insulating film IIn and the passivation film PV is discontinued, is formed between the first wring layer I1 and the second wiring layer I2, as illustrated in FIG. 2. Accordingly, a leakage current between wiring, which may flow through the interface, can be reduced, and the withstand voltage between the first wiring layer I1 and the second wiring layer I2 can be improved. Alternatively, the distance between the first wiring layer I1 and the second wiring layer I2 can be reduced while the withstand voltage between them is being maintained at the same level, thereby allowing the area of a product to be reduced.

Also in the present embodiment, the trench TR is formed in the interlayer insulating film IIn, and the air gap AG is formed in the trench TR with the passivation film PV blocking the trench TR. By forming the air gap AG with the use of the trench TR in this way, a discontinued part, in which the interface between the interlayer insulating film IIn and the passivation film PV is discontinued, can be easily formed.

Also, there is the effect that, when the depth D of the trench TR becomes larger, the pathway of a leakage current becomes physically longer and electric field strength is reduced.

Figure 14:
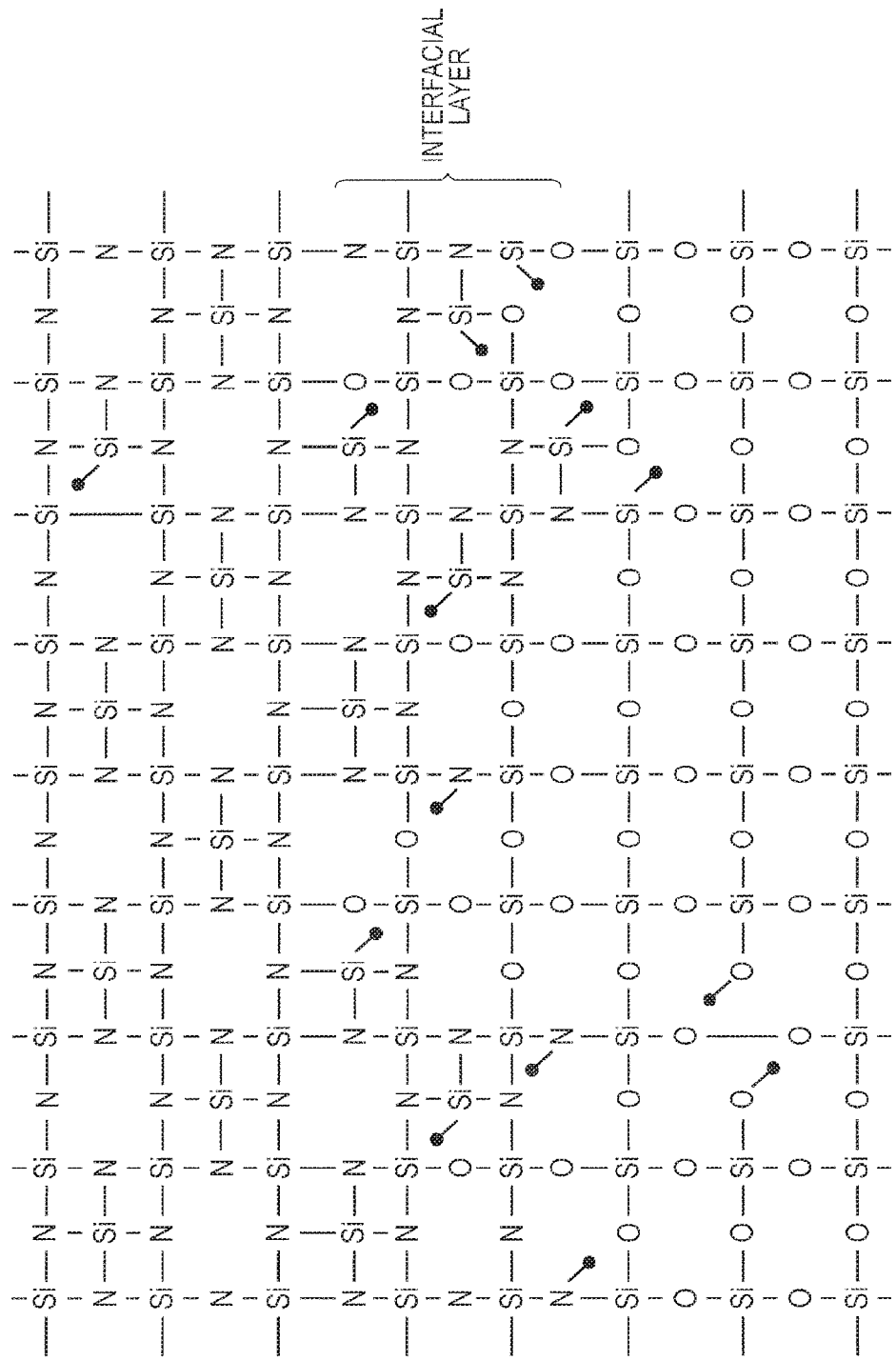
FIG. 14 is a view illustrating an image of a dangling bond.

In the present embodiment, the interlayer insulating film IIn and the passivation film PV include respective materials different from each other. As illustrated in FIG. 14, many dangling bonds (indicated by black circles in the view), each of which is an uncombined hand, are present in an interface where materials of different types (e.g., a silicon oxide film and a silicon nitride film) are coupled together. Accordingly, there is the possibility that a leakage current between wiring, which flows through the interface, may be increased. In the embodiment, however, a discontinued part, in which the interface between the interlayer insulating film IIn and the passivation film PV is discontinued, is formed between the first wiring layer I1 and the second wiring layer I2, as described above. Thereby, a leakage current between wiring, which may flow through an interface where materials of different types are coupled together, can be reduced.

Alternatively, the interlayer insulating film IIn and the passivation film PV may include the same material as each other in the present embodiment. When the interlayer insulating film IIn is exposed to the air, for example, after being formed, moisture is adhered to the surface of the interlayer insulating film IIn. When the passivation film PV is subsequently formed over the interlayer insulating film IIn, a leak path based on the moisture is caused in the interface between the interlayer insulating film IIn and the passivation film PV. In the embodiment, however, a discontinued part, in which the interface between the interlayer insulating film IIn and the passivation film PV is discontinued, is formed between the first wiring layer I1 and the second wiring layer I2, as described above. Thereby, a leakage current between wiring, which may flow through an interface where materials of the same type are coupled together, can be reduced.

Also in the present embodiment, each of the first wiring layer I1 and the second wiring layer I2 is a wiring layer of the uppermost layer, as illustrated in FIG. 2. It is usual that the interlayer insulating film IIn in the lower layer of the wiring layer of the uppermost layer includes a silicon oxide film and the passivation film PV in the upper layer of the wiring layer of the uppermost layer includes a silicon nitride film. Accordingly, many dangling bonds, each of which is an uncombined hand, are present in an interface where the interlayer insulating film IIn and the passivation film PV are coupled together, as described above. Accordingly, a leakage current between wiring, which may flow through the interface, can be effectively reduced by forming such a discontinued part in which the interface between the interlayer insulating film IIn and the passivation film PV is discontinued.

Also in the present embodiment, the first wiring layer I1 is one transformer that forms a microisolator, while the second wiring layer I2 is the other transformer that forms it, as illustrated in FIGS. 12 and 13. By thus forming a discontinued part, in which the interface between the interlayer insulating film IIn and the passivation film PV is discontinued, between a pair of the transformers of a microisolator, the withstand voltage between the transformers of the microisolator can be improved.

Also in the present embodiment, the air gap AG surrounds the whole circumference of each of the first wiring layer I1 and the second wiring layer I2, as illustrated in FIGS. 12 and 13. Thereby, the withstand voltage between the wiring and another wiring layer located along the whole circumference of each of the first wiring layer I1 and the second wiring layer I2 can be improved.

Also in the present embodiment, the air gap AG is continuously extended to surround the whole circumference of each of the first wiring layer I1 and the second wiring layer I2, as illustrated in FIG. 12. Thereby, a leakage current between wiring can be reduced in the whole region along the whole circumference.

Also in the present embodiment, the air gap AG is intermittently extended to surround the whole circumference of each of the first wiring layer I1 and the second wiring layer I2, as illustrated in FIG. 13. Thereby, the flexibility, in which the air gap AG and the trench TR are arranged, can be increased and a leakage current between wiring can be efficiently reduced.

Second Embodiment

Figure 15:
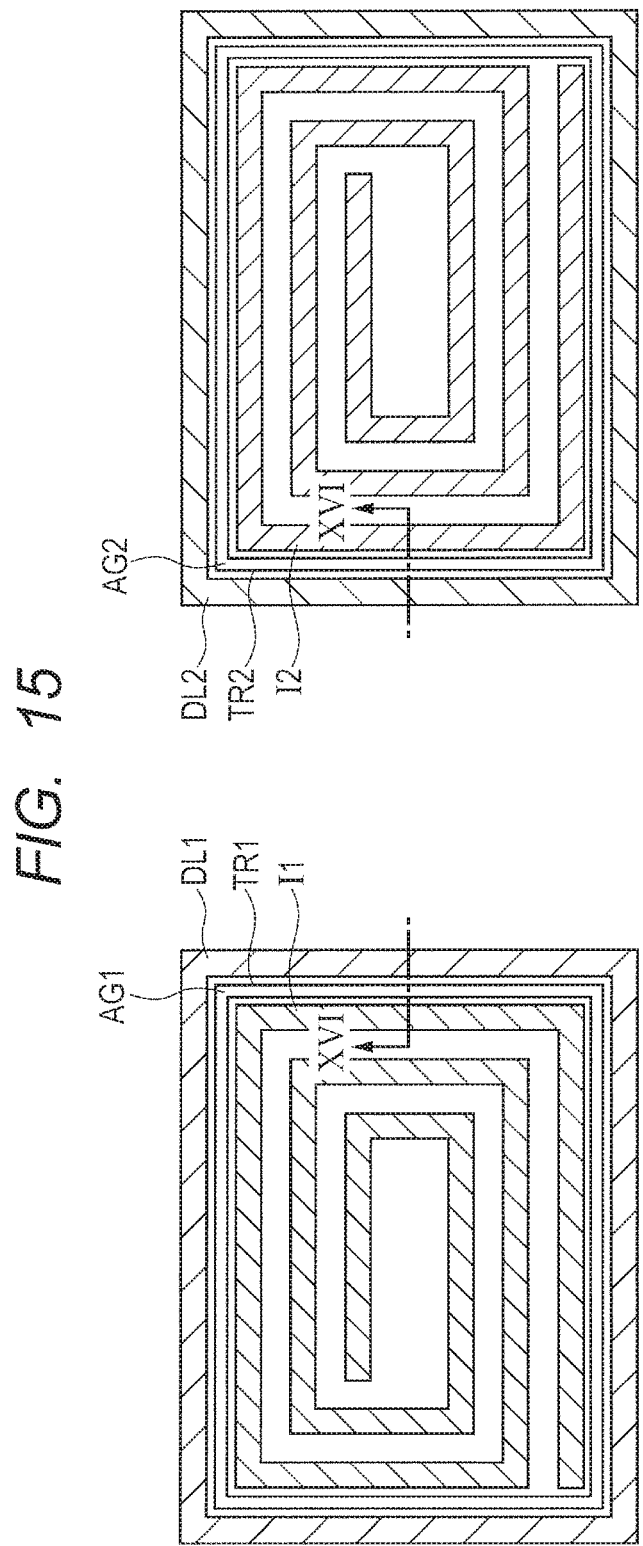
FIG. 15 is a plan view schematically illustrating a configuration of a semiconductor device in Second Embodiment.
Figure 16:
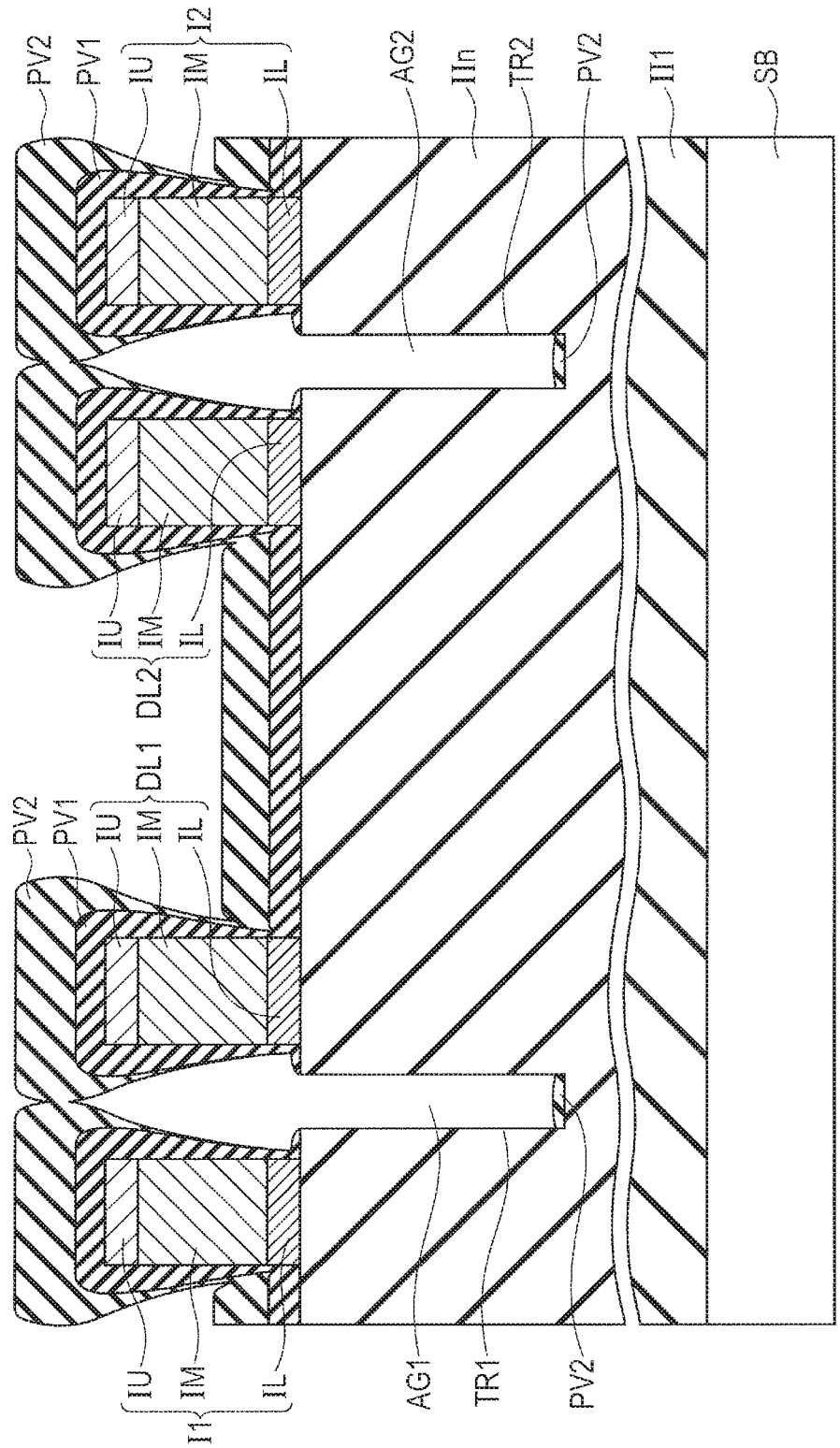
FIG. 16 is a schematic sectional view, taken along XVI-XVI Line in FIG. 15.

As illustrated in FIGS. 15 and 16, the configurations of the present embodiment is different from that illustrated in FIG. 12 in terms of the following three points. The first point is that a first dummy wiring layer DL1 and a second dummy wiring layer DL2 are added in the configuration of the present embodiment. The second point is that a first trench TR1 and a first air gap AG1 are arranged between the first dummy wiring layer DL1 and the first wiring layer I1. The third point is that a second trench TR2 and a second air gap AG2 are arranged between the second dummy wiring layer DL2 and the second wiring layer I2.

Each of the first dummy wiring layer DL1 and the second dummy wiring layer DL2 is not electrically coupled to an electrical circuit and has a floating electric potential. The first dummy wiring layer DL1 continuously surrounds the whole circumference of the first wiring layer (first transformer) I1 in plan view. The second dummy wiring layer DL2 continuously surrounds the whole circumference of the second wiring layer (second transformer) I2 in plan view.

The first trench TR1 is formed in the upper surface of the interlayer insulating film (first insulating film) IIn between the first wiring layer I1 and the first dummy wiring layer DL1. The second trench TR2 is formed in the upper surface of the interlayer insulating film IIn between the second wiring layer I2 and the second dummy wiring layer DL2.

A first passivation film (second insulating film) PV1 is formed to come in contact with the side surface and the upper surface of each of the wiring layers I1, I2, DL1, and DL2 and to come in contact with the upper surface of the interlayer insulating film IIn.

A second passivation film (third insulating film) PV2 blocks the upper portion of each of the first and second trenches TR1 and TR2. Thereby, the first air gap AG1 is formed in the first trench TR1, and the second air gap AG2 is formed in the second trench TR2.

The upper end of each of the first and second air gaps AG1 and AG2 is located above the upper surface of each of the wiring layers I1, I2, DL1, and DL2. The first trench TR1 and the first air gap AG1 are extended to continuously surround the whole circumference of the first wiring layer I1 in plan view. The second trench TR2 and the second air gap AG2 are extended to continuously surround the whole circumference of the second wiring layer I2 in plan view.

Of the configurations of the present embodiment, the configurations other than those described above are almost the same as those of First Embodiment illustrated in FIG. 12, and hence like elements are denoted with like reference numerals and description thereof is not repeated.

Subsequently, a manufacturing method of a semiconductor device according to the present embodiment will be described with reference to FIGS. 17 to 18.

In the manufacturing method of the present embodiment, the steps similar to those of First Embodiment illustrated in FIGS. 3 to 7 are first performed. Thereby, the first wiring layer I1, the second wiring layer I2, the first dummy wiring layer DL1, and the second dummy wiring layer DL2 are formed over the upper surface of the interlayer insulating film IIn, as illustrated in FIG. 17.

Each of these wiring layers I1, I2, DL1, and DL2 has a configuration in which the wiring lower layer IL, the wiring body layer IM, and the wiring upper layer IU are laminated in this order from below. The thickness of each of the wiring lower layer IL and the wiring upper layer IU is, for example, 100 nm. The thickness of the wiring body layer IM is, for example, 1000 nm.

Further, thin titanium layers, although not illustrated, may be formed over and below the wiring upper layer ID and the wiring lower layer IL including titanium nitride, respectively, in order to improve the adhesiveness with an upper layer and a lower layer or to reduce contact resistance.

A first space S1 between the first wiring layer I1 and the first dummy wiring layer DL1 and a second space S2 between the second wiring layer I2 and the second dummy wiring layer DL2 are sufficiently small within a range that can be patterned by a photolithography technique. The aforementioned first and second spaces S1 and S2 are smaller than a third space S3 between the first dummy wiring layer DL1 and the second dummy wiring layer DL2.

Thereafter, the first passivation film (second insulating film) PV1 is formed to cover each of these wiring layers I1, I2, DL1, and DL2 and to come in contact with the upper surface of the interlayer insulating film IIn. As described above, the spaces S1 and S2 are sufficiently small within a range that can be patterned by a photolithography technique and smaller than the space S3. Accordingly, a thickness t3 of the passivation film PV formed in each of the spaces S1 and S2 is smaller than both a thickness t1 thereof formed directly over each of the wiring layers I1, I2, DL1, and DL3 and a thickness t2 thereof formed in the space S3.

Figure 18:
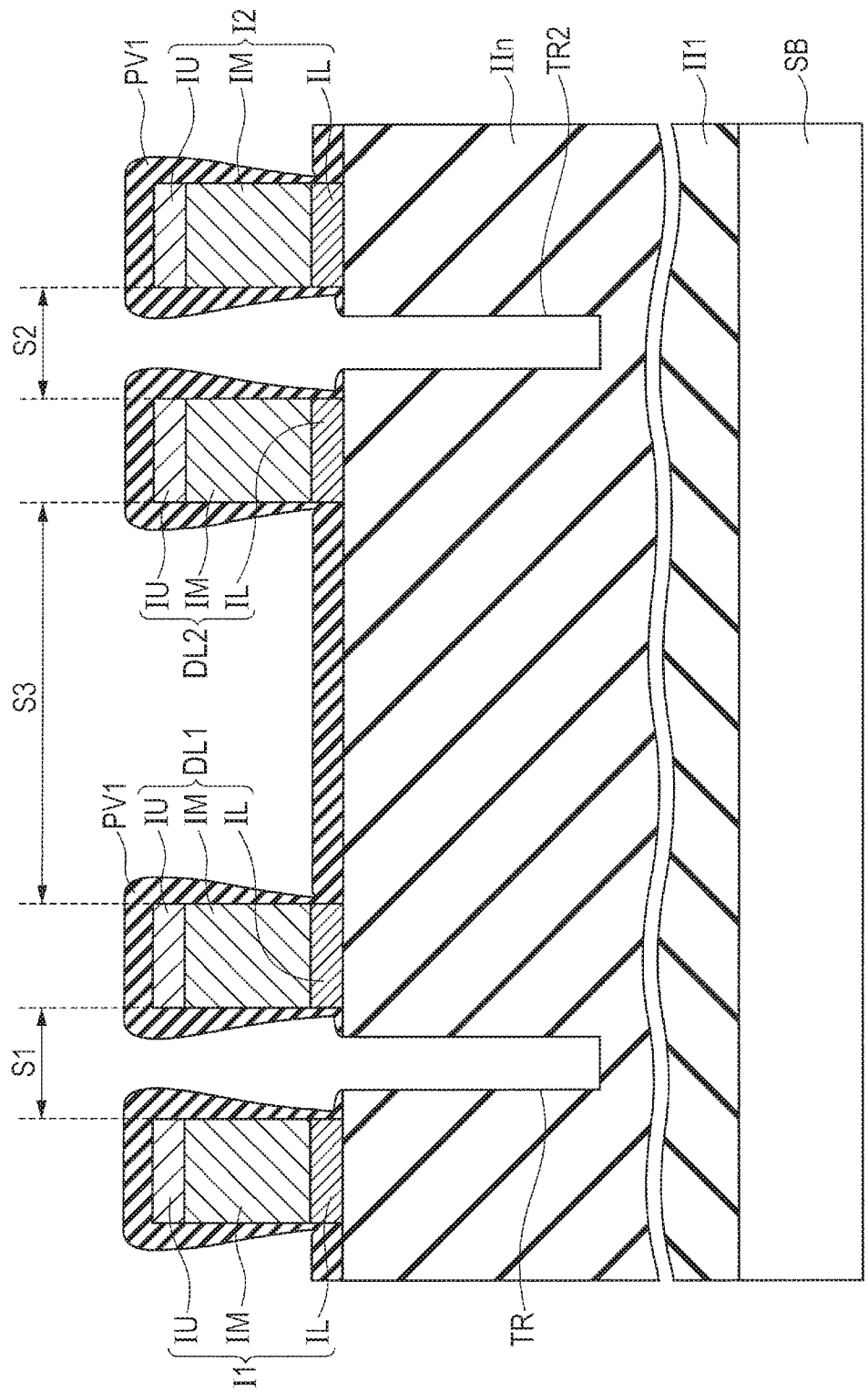
FIG. 18 is a sectional view schematically illustrating a second step of the manufacturing method of a semiconductor device in Second Embodiment.

As illustrated in FIG. 18, anisotropic etching (etchback) is performed on the whole passivation film PV. In this case, the interlayer insulating film IIn is removed in each of the first and second spaces S2 and S2 such that the trenches TR1 and TR2 are formed in the interlayer insulating film IIn, while the passivation film PV is left in the third space S3. Specifically, it is as follows.

The thickness t3 of the passivation film PV formed in each of the first and second spaces S1 and S2 is smaller than the thicknesses t1 and t2 thereof formed in other portions. In the aforementioned anisotropic etching, the upper surface of the interlayer insulating film IIn in each of the first and second spaces S1 and S2 is therefore exposed ahead of the third space S3.

In the aforementioned anisotropic etching, the upper surface of the interlayer insulating film IIn exposed in each of the spaces S1 and S2 is then etched by using the passivation film PV left over both the third space S3 and each of the wiring layers I1, I2, DL1, and DL2 as a mask. Thereby, the trenches TR1 and TR2 are formed in the interlayer insulating film IIn in a self-aligned manner without using a photolithography technique.

As illustrated in FIG. 16, the second passivation film (third insulating film) PV2 including, for example, silicon nitride is formed over the first passivation film PV1 by a plasma CVD method. The first passivation film PV1 blocks the trenches TR1 and TR2 that are located in the first and second spaces S1 and S2, respectively. Thereby, the blocked air gaps AG1 and AG2 are formed in the trenches TR1 and TR2, respectively.

The semiconductor device according to the present embodiment illustrated in FIGS. 15 and 16 is thus manufactured. Subsequently, operations and effects of the present embodiment will be described.

According to the present embodiment, a discontinued part, in which the interface between the interlayer insulating film IIn and the passivation film PV is discontinued, is formed between the first wiring layer I1 and the first dummy wiring layer DL1, as illustrated in FIG. 16. Further, a discontinued part, in which the interface between the interlayer insulating film IIn and the passivation film PV is discontinued, is formed between the second wiring layer I2 and the second dummy wiring layer DL2.

Accordingly, a leakage current between the first wiring layer I1 and the second wiring layer I2, which may flow through the interface, can be reduced, and the withstand voltage between the first wiring layer I1 and the second wiring layer I2 can be further improved. Alternatively, the distance between the first wiring layer I1 and the second wiring layer I2 can be reduced while the withstand voltage between them is being maintained at the same level, thereby allowing the area of a product to be reduced.

Furthermore, according to the present embodiment, the trenches TR1 and TR2 are formed in the interlayer insulating film inn, and the air gaps AG1 and AG2 are formed in the respective trenches TR1 and TR2 with the second passivation film PV2 blocking the trenches TR1 and TR2. Thereby, a leakage current between the first wiring layer I1 and the second wiring layer I2 can be reduced while the trenches TR1 and TR2 are being formed in a self-aligned manner, as described above.

Furthermore, according to the present embodiment, the first dummy wiring layer DL1 surrounds the whole circumference of the first wiring layer I1. The second dummy wiring layer DL2 surrounds the whole circumference of the second wiring layer I2. Thereby, the whole circumferences of the first and second wiring layers I1 and I2 are surrounded by the air gaps AG1 and AG2, respectively. Accordingly, the withstand voltage between the wiring and another wiring layer located along the whole circumference of each of the first wiring layer I1 and the second wiring layer I2 can be improved.

Furthermore, according to the manufacturing method of the present embodiment, the trenches TR1 and TR2 can be formed in a self-aligned manner without using a photolithography technique by arranging the first and second dummy wiring layers DL1 and DL2 near to the first wiring layer and the second wiring layer, respectively. Accordingly, the step of performing photolithography can be omitted, thereby allowing the steps to be simplified.

In the present embodiment, the case has been described where one dummy wiring layer is arranged with respect to one wiring layer; however, two or more dummy wiring layers may be arranged to surround the circumference of one wiring layer. In this case, double or more air gaps are formed with respect to one wiring layer, and hence a withstand voltage margin can be further improved.

Conversely, when a circuit is employed in which a high voltage is applied only to some wiring layers and only a low voltage is applied to the remaining wiring layers, a dummy wiring layer and an air gap may be formed only near one of the wiring layers to which a high voltage is to be applied. Thereby, the disadvantage that an area is increased due to the arrangement of the dummy wiring layer can be reduced.

Third Embodiment

Figure 19:
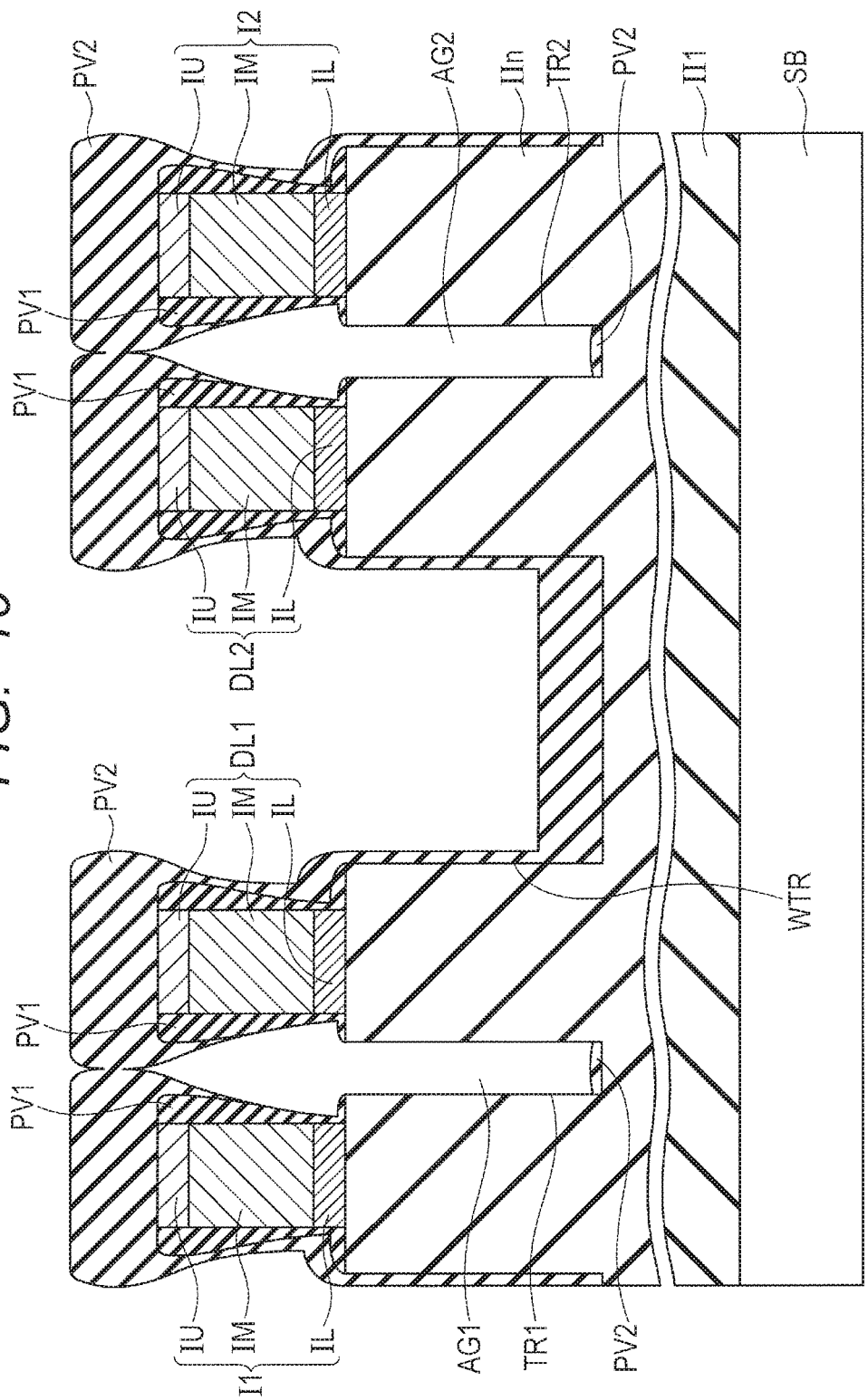
FIG. 19 is a sectional view schematically illustrating a configuration of a semiconductor device in Third Embodiment.

As illustrated in FIG. 19, the configuration of the present embodiment is different from that of Second Embodiment illustrated in FIG. 16 in that a trench WTR is formed in the interlayer insulating film IIn between the first dummy wiring layer DL1 and the second dummy wiring layer DL2.

The second passivation film PV2 is formed over the side surface and the bottom surface of the trench WTR. The first passivation film PV1 is not formed over the upper surface of each of the wiring layers I1, I2, DL1, and DL2. The second passivation film PV2 comes in contact with the upper surface of each of the wiring layers I1, I2, DL1, and DL2.

Of the configurations of the present embodiment, the configurations other than those described above are almost the same as those of Second Embodiment illustrated in FIG. 16, and hence like elements are denoted with like reference numerals and description thereof is not repeated.

Subsequently, a manufacturing method of a semiconductor device of the present embodiment will be described with reference to FIG. 20. In the manufacturing method of the embodiment, the steps similar to those of First Embodiment illustrated in FIGS. 3 to 7 are first performed, and then the steps similar to those of Second Embodiment illustrated in FIG. 17 are performed. Thereafter, anisotropic etching (etch-back) is performed on the whole first passivation film PV1.

Figure 20:
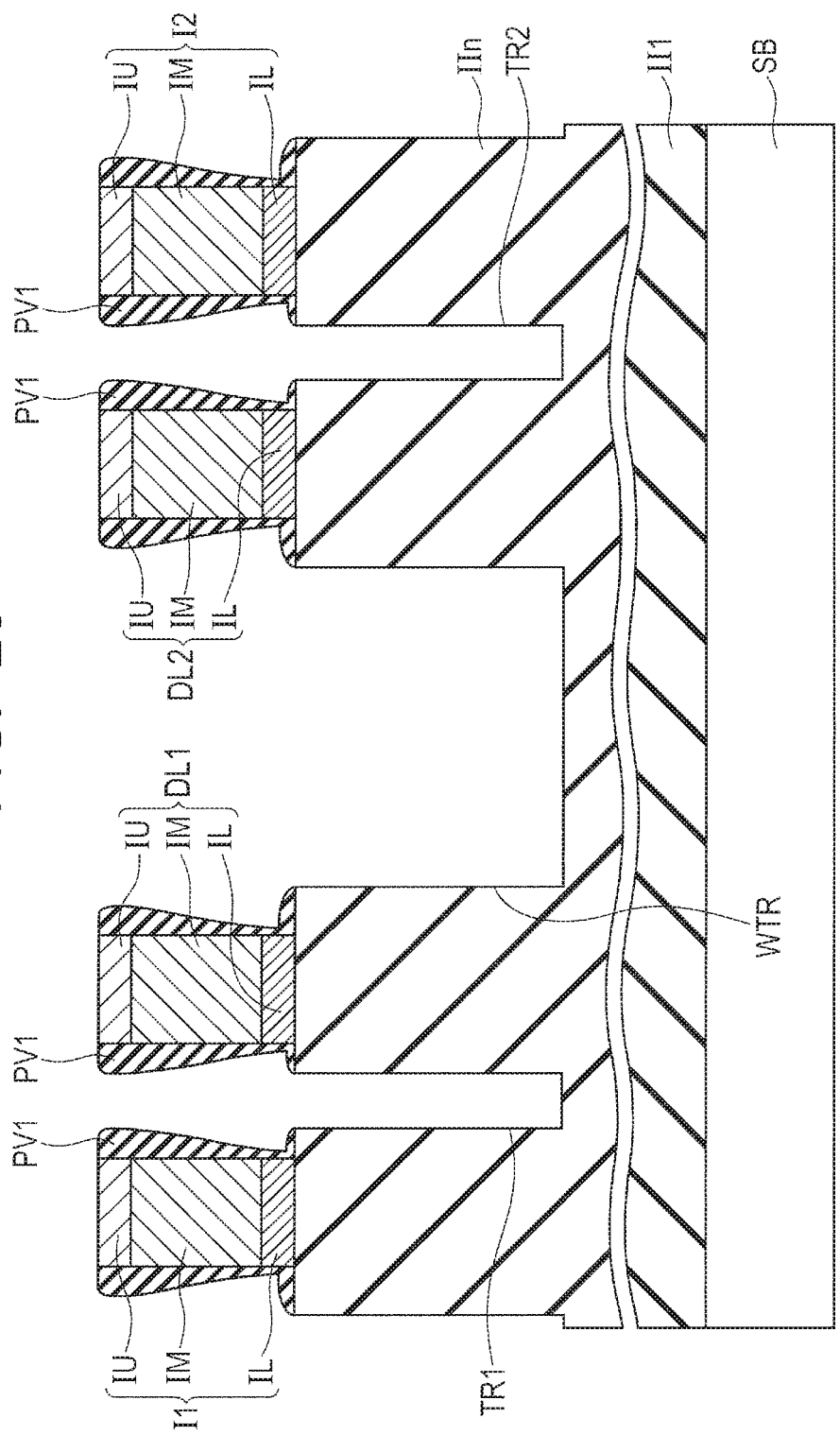
FIG. 20 is a sectional view schematically illustrating a manufacturing method of a semiconductor device in Third Embodiment.

As illustrated in FIG. 20, the upper surface of the interlayer insulating film IIn and that of each of the wiring layers I1, I2, DL1, and DL2 are exposed by the aforementioned anisotropic etching. Thereafter, the upper surface of the interlayer insulating film IIn and that of each of the wiring layers I1, I2, DL1, and DL2 are further etched.

For the etching, the etching selection ratio of the wiring upper layer IU of each of the wiring layer I1, I2, DL1, and DL2 is set to be large, while that of the interlayer insulating film IIn is set to be small. Accordingly, the wiring upper layer ID is hardly etching-removed in the etching, but the interlayer insulating film IIn is etching-removed, so that the trenches TR1, TR2, and WTR are formed. Thereby, the trenches TR1, TR2, and WTR are formed in the interlayer insulating film IIn in a self-aligned manner without using a photolithography technique.

As illustrated in FIG. 19, the second passivation film (third insulating film) PV2 including, for example, silicon nitride is formed over the first passivation film PV1 by a plasma CVD method. The first passivation film PV1 blocks both the trenches TR1 and TR2. Additionally, the first passivation film PV1 is formed over the side surface and the bottom surface of the trench WTR. Thereby, the blocked air gaps AG1 and AG2 are formed in the trenches TR1 and TR2, respectively.

The semiconductor device of the present embodiment illustrated in FIG. 19 is thus manufactured. According to the embodiment, operations and effects the same as those of Second Embodiment can be obtained.

According to the present embodiment, the trench WTR is formed between the first dummy wiring layer DL1 and the second dummy wiring layer DL2. Accordingly, the distance of a leakage current pathway between the first wiring layer I1 and the second wiring layer I2 (creepage distance of the interface between the interlayer insulating film IIn and the first passivation film PV1) can be increased. Thereby, the electric field strength along the current pathway between the first wiring layer I1 and the second wiring layer I2 can be reduced, and a withstand voltage margin can be improved.

In the present embodiment, the case has been described where one dummy wiring layer is arranged with respect to one wiring layer; however, two or more dummy wiring layers may be arranged to surround the circumference of one wiring layer. In this case, double or more air gaps are formed with respect to one wiring layer, and hence a withstand voltage margin can be further improved.

Conversely, when a circuit is employed in which a high voltage is applied only to some wiring layers and only a low voltage is applied to the remaining wiring layers, a dummy wiring layer and an air gap may be formed only near one of the wiring layers to which a high voltage is to be applied. Thereby, the disadvantage that an area is increased due to the arrangement of the dummy wiring layer can be reduced.

When a dummy wiring layer is formed only near one of wiring layers to which a high voltage is to be applied, the trench WTR is arranged between the dummy wiring layer and the other of the wiring layers (wiring layer to which a low voltage is to be applied.)

Fourth Embodiment

Figure 21:
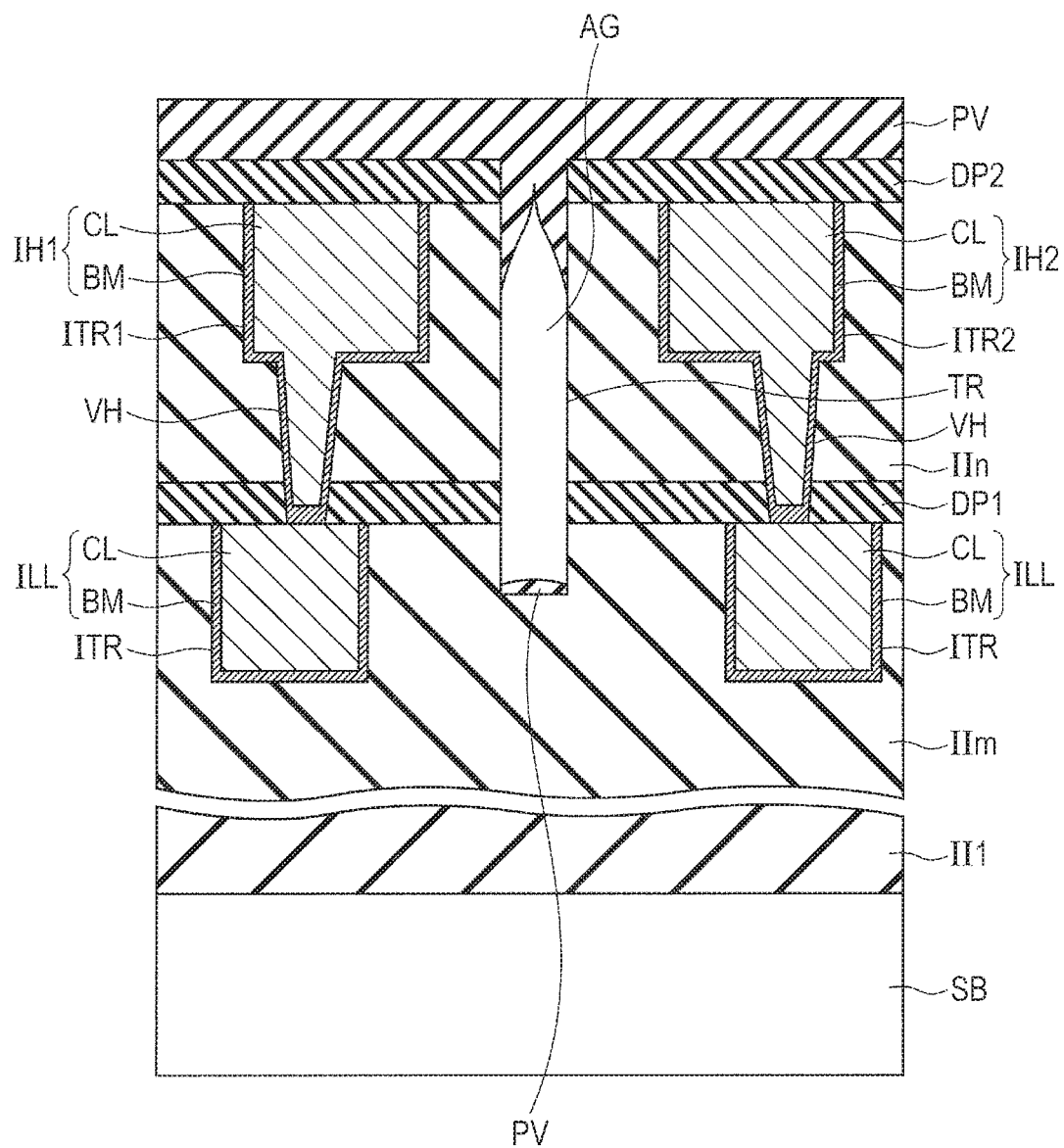
FIG. 21 is a sectional view schematically illustrating a configuration of a semiconductor device in Fourth Embodiment.

In the semiconductor device of the present embodiment, the wiring layer includes copper, as illustrated in FIG. 21. Incidentally, in this figure, Cl is a copper wiring formed by a damascene process. A MOS transistor (not illustrated) and the like are formed over the surface of the semiconductor substrate SB including, for example, silicon.

An interlayer insulating film II1 is formed over the surface of the semiconductor substrate SB so as to cover the MOS transistor and the like. A conductive layer (not illustrated), such as a wiring layer, is formed over the interlayer insulating film II1.

Such interlayer insulating films and conductive layers are laminated repeatedly. A wiring trench ITR is formed in the upper surface of an interlayer insulating film IIm. A lower wiring layer ILL is formed in the wiring trench ITR. The lower wiring layer ILL has a barrier metal layer BM and a conductive layer CL including copper.

The barrier metal layer BM is formed along the side surface and the bottom surface of the wiring trench ITR. The conductive layer CL is embedded in the wiring trench ITR. A diffusion prevention film DP1 is formed to cover the lower wiring layer ILL and to come in contact with the upper surface of the interlayer insulating film IIm.

The interlayer insulating film (second insulating film) IIn is formed over the diffusion prevention film DP1. A plurality of wiring trenches are formed in the upper surface of the interlayer insulating film IIn. The wiring trenches include a first wiring trench ITR1 and a second wiring trench ITR2.

A via hole VH is coupled to the bottom surface of each of the first and second wiring trenches ITR1 and ITR2. The via hole VH reaches the lower wiring layer ILL from the bottom surface of each of the first and second wiring trenches ITR1 and ITR2.

A first wiring layer IH1 is formed in the first wiring trench ITR1 and the via hole VH. The first wiring layer IH1 has a barrier metal layer BM and a conductive layer CL including copper. The barrier metal layer BM is formed: along the side surface and the bottom surface of the first wiring trench ITR1; and along the side surface and the bottom surface of the via hole VH. The conductive layer CL is embedded in the first wiring trench ITR1 and the via hole VH. Of the first wiring layer IH1, the portion in the first wiring trench ITR1 is a wiring portion, while that in the via hole VH is a plug portion.

A second wiring layer IH2 is formed in the second wiring trench ITR2 and the via hole VH. The second wiring layer IH2 has a barrier metal layer BM and a conductive layer CL including copper. The barrier metal layer IBM is formed: along the side surface and the bottom surface of the second wiring trench ITR2; and along the side surface and the bottom, surface of the via hole VH. The conductive layer CL is embedded in the second wiring trench ITR2 and the via hole VH. Of the second wiring layer IH2, the portion in the second wiring trench ITR2 is a wiring portion, while that in the via hole VH is a plug portion.

From the fact described above, the interlayer insulating film IIn comes in contact with the side surfaces of both the first and second wiring layers IH1 and IH2. Each of the first wiring layer IH1 and the second wiring layer IH2 is a wiring layer of the uppermost layer.

A diffusion prevention film (first insulating film) DP2 is formed to come in contact with the upper surfaces of both the first and second wiring layers IH1 and IH2 and to come in contact with the upper surface of the interlayer insulating film IIn.

A discontinued part, in which the interface between the interlayer insulating film IIn and the diffusion prevention film DP2 is discontinued, is formed between the first wiring layer IH1 and the second wiring layer IH2. The interlayer insulating film IIn faces the air gap AG in the discontinued part.

Specifically, a trench TR is formed, between the first wiring layer IH1 and the second wiring layer IH2, so as to penetrate, from the upper surface of the diffusion prevention film DP2, each of the diffusion prevention film DP2, the interlayer insulating film IIn, and the diffusion prevention film DP1 and to reach the interlayer insulating film IIm. A passivation film PV is formed to come in contact with the upper surface of the diffusion prevention film, DP2 and to block the upper end of the trench TR. Thereby, a blocked air gap AG is formed in the trench TR.

The trench TR is formed to penetrate the diffusion prevention film DP2 and the interlayer insulating film IIn. Accordingly, the interface between the diffusion prevention film DP2 and the interlayer insulating film IIn is discontinued inside the trench TR.

It is preferable that the depth of the trench TR with respect to the width thereof (aspect ratio) is large. The width of the trench TR is, for example, 100 nm, while the depth is, for example, 1000 nm.

Of a plurality of interlayer insulating films, the interlayer insulating film IIn is an interlayer insulating film in the uppermost layer. Each of the interlayer insulating films II1, IIm, and IIn is an insulating film containing silicon oxide, and includes, for example, silicon carbon oxide. The diffusion prevention film DP1 includes, for example, silicon nitride. The barrier metal layer BM includes, for example, tantalum nitride.

Also in the present embodiment, a discontinued part, in which the interface between the interlayer insulating film IIn and the diffusion prevention film DP2 is discontinued, is formed between the first wiring layer IH1 and the second wiring layer IH2, as illustrated in FIG. 21. Accordingly, a leakage current between wiring, which may flow through the interface, can be reduced, and the withstand voltage between the first wiring layer IH1 and the second wiring layer IH2 can be improved. Alternatively, the distance between the first wiring layer IH1 and the second wiring layer IH2 can be reduced while the withstand voltage between them is being maintained at the same level, thereby allowing the area of a product to be reduced.

(Variations)

Figure 22:
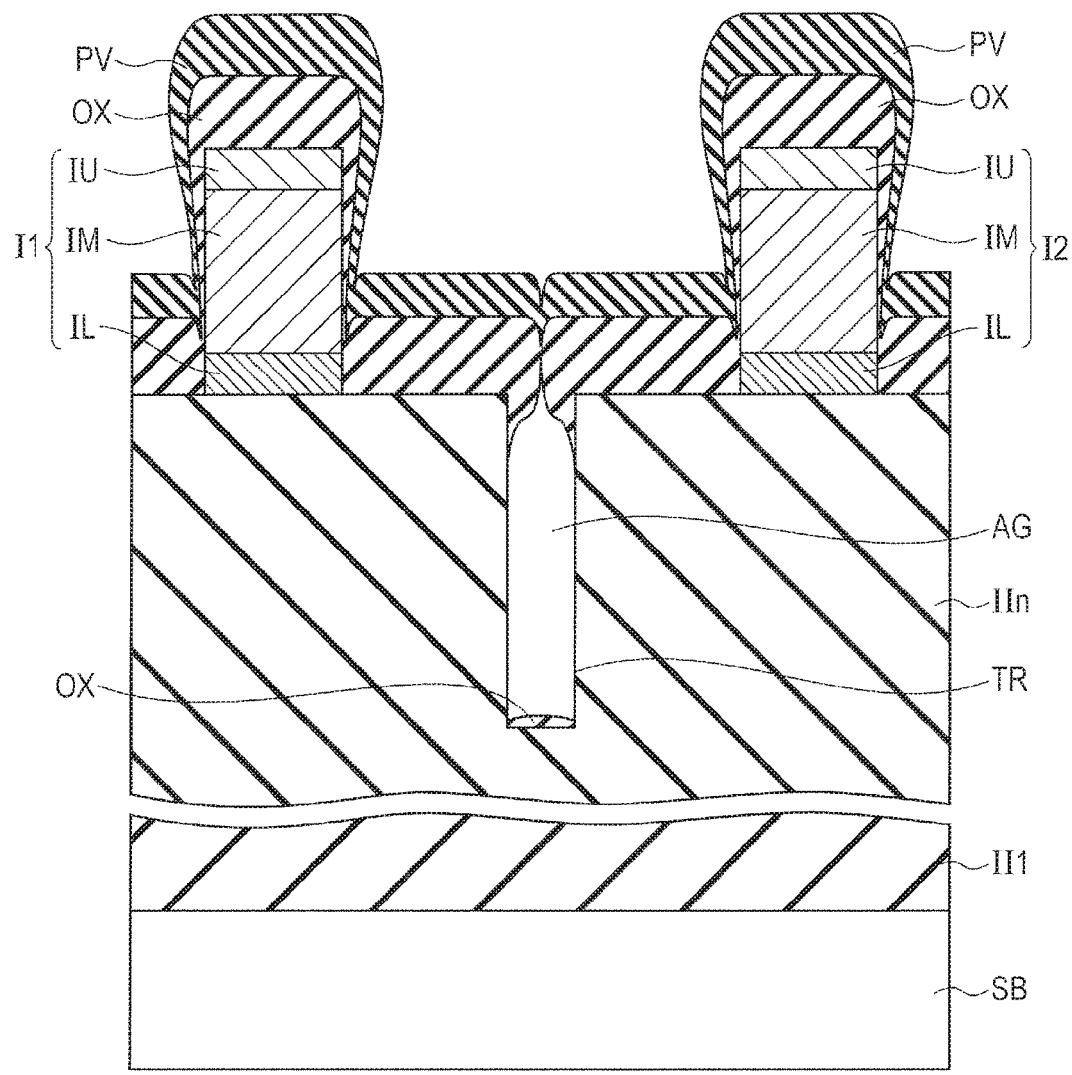
FIG. 22 is a sectional view schematically illustrating a configuration of a semiconductor device in First Variation.

As illustrated in FIG. 22, the configuration of First Variation is different from that of First Embodiment illustrated in FIG. 2 in that an insulating film (second insulating film) OX is added below a passivation film PV including a silicon nitride film.

The insulating film OX includes the same material as that of the interlayer insulating film IIn, and includes, for example, a silicon oxide film. The insulating film OX comes in contact with the upper surfaces and the side surfaces of both the wiring layers I1 and I2 as well as the upper surface of the interlayer insulating film IIn. The insulating film OX blocks the trench TR. The passivation film PV is formed to come in contact with the upper surface of the insulating film OX.

Of the configurations of the present embodiment, the configurations other than those described above are almost the same as those of First Embodiment illustrated in FIG. 2, and hence like elements are denoted with like reference numerals and description thereof is not repeated.

Also in the configuration of First Variation, a discontinued part, in which the interface between the interlayer insulating film IIn and the insulating film OX is discontinued, is formed between the first wiring layer I1 and the second wiring layer I2, as illustrated in FIG. 22. Accordingly, a leakage current between wiring, which may flow through the interface, can be reduced, and the withstand voltage between the first wiring layer I1 and the second wiring layer I2 can be improved. Alternatively, the distance between the first wiring layer I1 and the second wiring layer I2 can be reduced while the withstand voltage between them is being maintained at the same level, thereby allowing the area of a product to be reduced.

Figure 23:
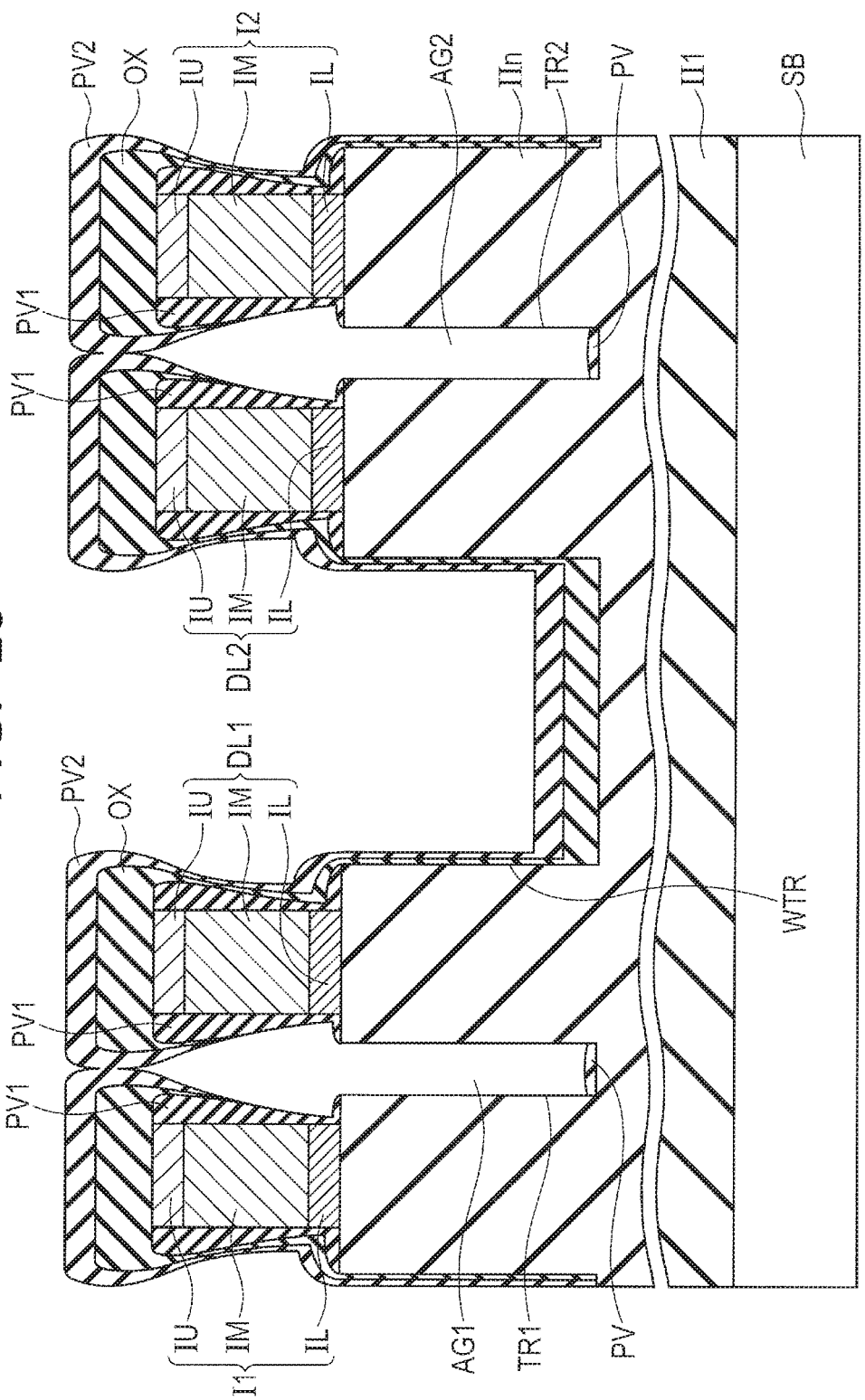
FIG. 23 is a sectional view schematically illustrating configuration of a semiconductor device in Second Variation.

As illustrated in FIG. 23, the configuration of Second Variation is different from that of Third Embodiment illustrated in FIG. 19 in that an insulating film (second insulating film) OX is added between the first passivation film PV1 and the second passivation film PV2.

The insulating film OX includes the same material as that of the interlayer insulating film IIn, and includes, for example, a silicon oxide film. The insulating film OX comes in contact with the upper surfaces of both the wiring layers I1 and I2 as well as the upper surface and the side surface of the passivation film PV1. The passivation film PV2 is formed to come in contact with the upper surface of the insulating film, OX and to block the trench TR.

Of the configurations of the present embodiment, the configurations other than those described above are almost the same as those of Third Embodiment illustrated in FIG. 19, and hence like elements are denoted with like reference numerals and description thereof is not repeated.

Also in the configuration of Second Variation, a discontinued part, in which the interface between the interlayer insulating film IIn and the insulating film, OX is discontinued, is formed between the first wiring layer I1 and the second wiring layer I2, as illustrated in FIG. 23. Accordingly, a leakage current between wiring, which may flow through the interface, can be reduced, and the withstand voltage between the first wiring layer I1 and the second wiring layer I2 can be improved. Alternatively, the distance between the first wiring layer I1 and the second wiring layer I2 can be reduced while the withstand voltage between them is being maintained at the same level, thereby allowing the area of a product to be reduced.

As illustrated in FIG. 16, the configurations of Third Variation is different from that of Second Embodiment in that a passivation film PV1 includes a silicon oxide film. Also in the configuration of Third Variation, the same operations and effects as those of Second Embodiment can be obtained.

Figure 17:
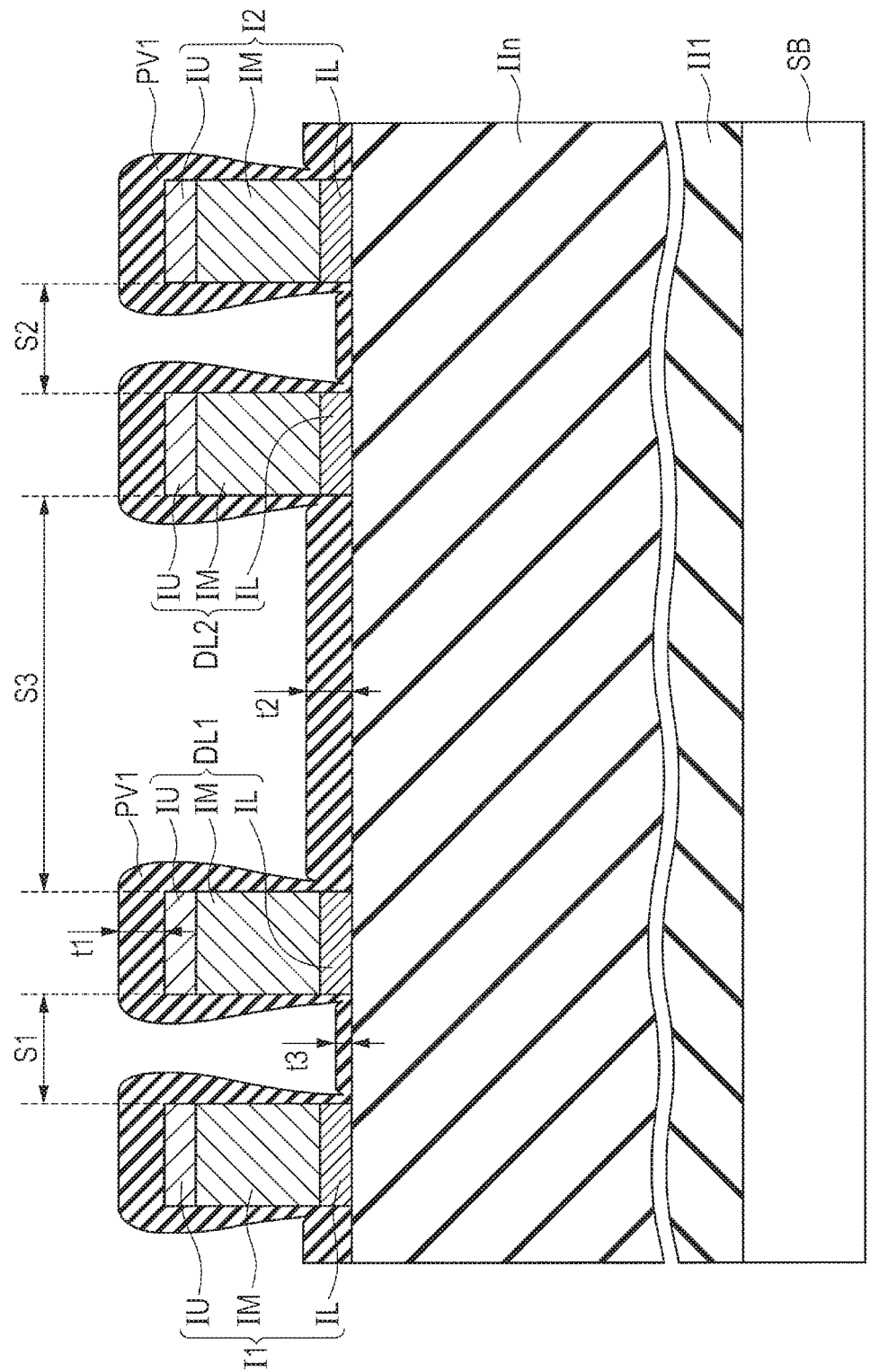
FIG. 17 is a sectional view schematically illustrating a first step of a manufacturing method of a semiconductor device in Second Embodiment.

As illustrated in FIG. 17, the configurations of Fourth Variation is different from that of Third Embodiment in that a passivation film PV1 includes a silicon oxide film. Also in the configuration of Fourth Variation, the same operations and effects as those of Second Embodiment can be obtained.

The invention made by the present inventors has been specifically described above based on preferred embodiments, but the invention should, not be limited to the preferred embodiments, and it is needless to say that various modifications may be made to the invention within a range not departing from the gist of the invention.

What is claimed is:

1. A semiconductor device comprising:
    a first wiring layer and a second wiring layer that are adjacent to each other with a space therebetween;
    a first insulating film that comes in contact with one of lower surfaces and upper surfaces of both the first wiring layer and the second wiring layer; and
    a second insulating film that comes in contact with the first insulating film as well as side surfaces of both the first wiring layer and the second wiring layer,
    wherein a discontinued part, in which an interface between the first insulating film and the second insulating film is discontinued, is formed between the first wiring layer and the second wiring layer, and at least one of the first insulating film and the second insulating film faces an air gap in the discontinued part.

2. The semiconductor device according to claim 1,
    wherein the first insulating film comes in contact with the lower surfaces of both the first wiring layer and the second wiring layer.

3. The semiconductor device according to claim 1,
    wherein the first insulating film comes in contact with the upper surfaces of both the first wiring layer and the second wiring layer.

4. The semiconductor device according to claim 1,
    wherein a trench is formed in the first insulating film, and the air gap is formed in the trench with the second insulating film blocking the trench.

5. The semiconductor device according to claim 1, further comprising a third insulating film formed over the second insulating film,
    wherein a trench is formed in the first insulating film, and the air gap is formed in the trench with the third insulating film blocking the trench.

6. The semiconductor device according to claim 1,
    wherein the first insulating film and the second insulating film are comprised of respective materials different from each other.

7. The semiconductor device according to claim 6,
    wherein one of the first insulating film and the second insulating film includes silicon oxide, and the other of them includes silicon nitride.

8. The semiconductor device according to claim 1,
    wherein the first insulating film and the second insulating film are comprised of the same material as each other.

9. The semiconductor device according to claim 1, further comprising a dummy wiring layer arranged between the first wiring layer and the second wiring layer,
    wherein the discontinued part and the air gap are located between at least one of the first wiring layer and the second wiring layer and the dummy wiring layer.

10. The semiconductor device according to claim 9,
    wherein the dummy wiring layer surrounds whole circumference of at least one of the first wiring layer and the second wiring layer.

11. The semiconductor device according to claim 1,
    wherein the air gap surrounds whole circumference of each of the first wiring layer and the second wiring layer.

12. The semiconductor device according to claim 11,
    wherein the air gap is continuously extended to surround whole circumference of each of the first wiring layer and the second wiring layer.

13. The semiconductor device according to claim 11,
    wherein the air gap is intermittently extended to surround whole circumference of each of the first wiring layer and the second wiring layer.

14. The semiconductor device according to claim 1,
    wherein each of the first wiring layer and the second wiring layer is a wiring layer of the uppermost layer.

15. The semiconductor device according to claim 1,
    wherein the first wiring layer is one transformer that forms a microisolator, and
    wherein the second wiring layer is the other transformer that forms the microisolator.

* * * * *